(12) United States Patent
Nishizawa et al.

(10) Patent No.: US 9,130,147 B2
(45) Date of Patent: Sep. 8, 2015

(54) VIBRATING REED, GYRO SENSOR, ELECTRONIC APPARATUS, AND MOBILE UNIT

(71) Applicant: Seiko Epson Corporation, Tokyo (JP)

(72) Inventors: Ryuta Nishizawa, Matsumoto (JP); Keiji Nakagawa, Minowa (JP)

(73) Assignee: Seiko Epson Corporation (JP)

( * ) Notice: Subject to any disclaimer, the term of this patent is extended or adjusted under 35 U.S.C. 154(b) by 318 days.

(21) Appl. No.: 13/868,472

(22) Filed: Apr. 23, 2013

(65) Prior Publication Data

US 2013/0283910 A1    Oct. 31, 2013

(30) Foreign Application Priority Data

Apr. 27, 2012 (JP) ................................. 2012-102896

(51) Int. Cl.
| | |
|---|---|
| G01C 19/56 | (2012.01) |
| H01L 41/047 | (2006.01) |
| G01C 19/5621 | (2012.01) |
| G01C 19/5607 | (2012.01) |

(52) U.S. Cl.
CPC ............ *H01L 41/0475* (2013.01); *G01C 19/56* (2013.01); *G01C 19/5607* (2013.01); *G01C 19/5621* (2013.01)

(58) Field of Classification Search
CPC .................................................. G01C 19/5621
USPC ......................................... 73/504.12, 504.16
See application file for complete search history.

(56) References Cited

U.S. PATENT DOCUMENTS

| | | | |
|---|---|---|---|
| 5,343,749 | A | 9/1994 | Macy |
| 5,408,876 | A | 4/1995 | Macy |
| 5,522,249 | A | 6/1996 | Macy |
| 2011/0140575 | A1 | 6/2011 | Nishizawa |
| 2012/0126664 | A1 | 5/2012 | Ogura et al. |
| 2013/0205898 | A1* | 8/2013 | Nakagawa ................. 73/504.16 |

FOREIGN PATENT DOCUMENTS

| | | |
|---|---|---|
| JP | 05256723 A | 10/1993 |
| JP | 08-327366 | 12/1996 |
| JP | 10-078326 | 3/1998 |
| JP | 2006-054602 A | 2/2006 |
| JP | 2008-014887 A | 1/2008 |
| JP | 2008209215 A | 9/2008 |
| JP | 2011-141266 A | 7/2011 |
| JP | 2012112748 A | 6/2012 |

* cited by examiner

*Primary Examiner* — John Chapman, Jr.
(74) *Attorney, Agent, or Firm* — Harness, Dickey & Pierce, P.L.C.

(57) ABSTRACT

A vibrating reed includes a base part. A drive vibrating arm, a detection vibrating arm, and an adjustment vibrating arm extend from the base part. A first adjustment electrode and a second adjustment electrode are connected to the adjustment vibrating arm. The first adjustment electrode generates an electrical signal in first phase. The second adjustment electrode generates an electrical signal in second phase opposite to the first phase. The electrical signals of the adjustment electrodes are superimposed on the detection signal of the detection vibrating arm, and thereby, vibration leakage components are cancelled out. The adjustment vibrating arm is partially sandwiched between a first electrode piece and a second electrode piece, and the adjustment vibrating arm is partially sandwiched between a third electrode piece and a fourth electrode piece.

12 Claims, 23 Drawing Sheets

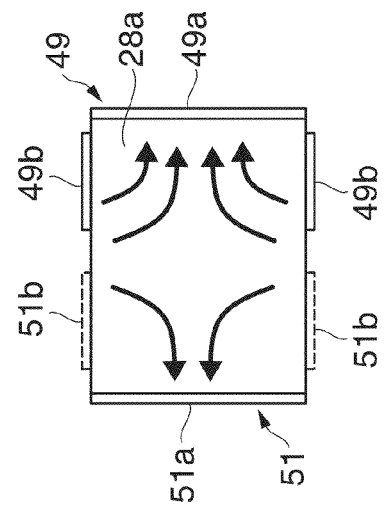
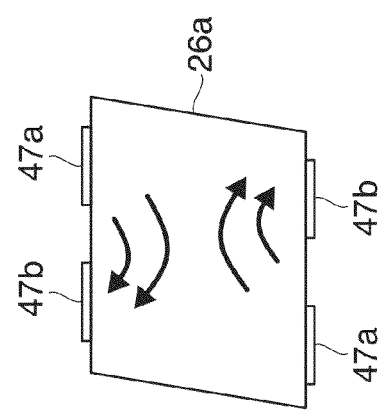
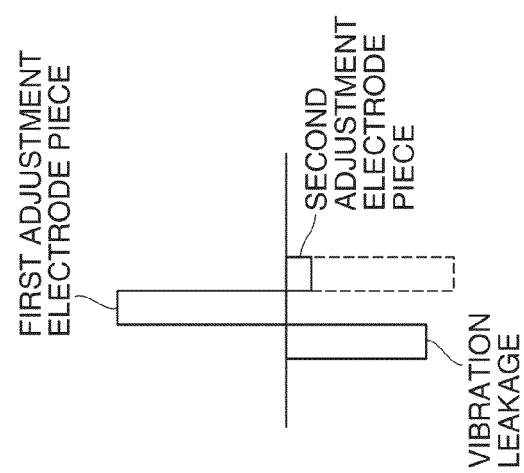
FIG. 10C
FIG. 10B
FIG. 10A

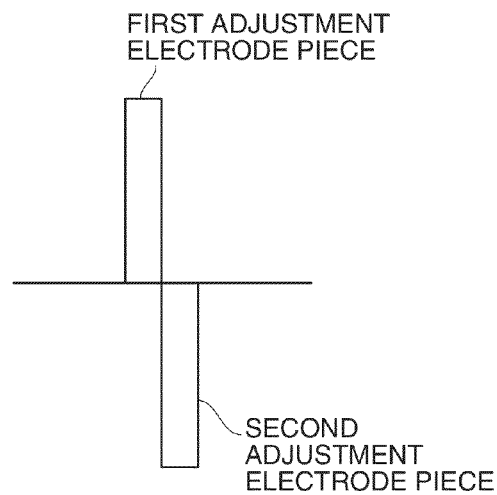
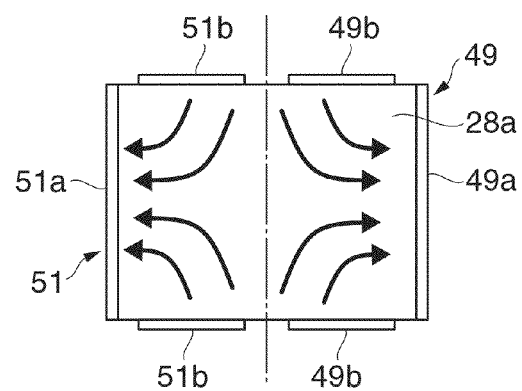
FIG. 11A
FIG. 11B
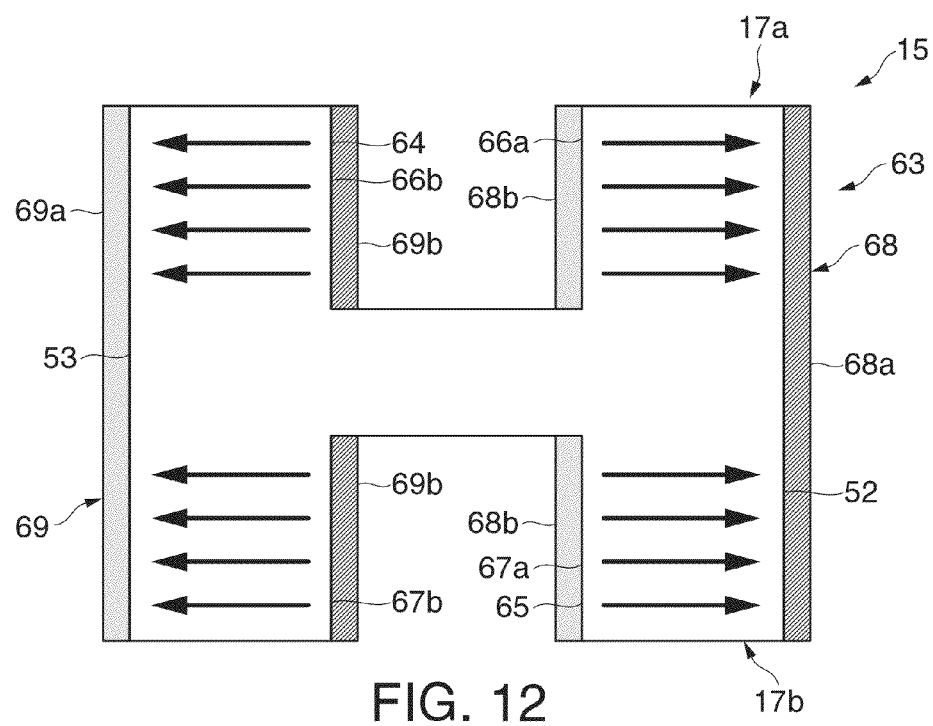
FIG. 12

VIBRATING REED, GYRO SENSOR, ELECTRONIC APPARATUS, AND MOBILE UNIT

BACKGROUND

1. Technical Field

The present invention relates to a vibrating reed, a gyro sensor using the vibrating reed, and an electronic apparatus, a mobile unit, etc. in which the vibrating reed is incorporated.

2. Related Art

For example, as described in Patent Document 1 (JP-A-5-256723), vibrating reeds used for gyro sensors are commonly known. When angular velocity motion is applied to a drive vibrating arm, the vibration direction of the drive vibrating arm changes due to action of Coriolis force. A new force component is generated in a specific direction in response to the Coriolis force. The force component causes motion of a detection vibrating arm. Accordingly, an output signal in response to the force component is output from the detection vibrating arm. In the example described in Patent Document 1, the detection vibrating arm and the drive vibrating arm continuously form one vibrating arm.

The main body of the vibrating reed may be cut out from a raw material such as a piezoelectric material, for example. For cutting out, masks are placed on the front surface and the rear surface of the raw material. When misalignment occurs between the masks, the side surface of the drive vibrating arm is not orthogonal to the front surface and the rear surface, but tilted. When a processing error is caused in the sectional shape of the drive vibrating arm on this account, the drive vibrating arm can not vibrate within a specified hypothetical plane, but vibrates in a hypothetical plane tilted from the specified hypothetical plane. The so-called diagonal vibration is generated. The phenomenon is called vibration leakage, and the vibration leakage component is superimposed on the force component in the output signal of the detection vibrating arm. As a result, the S/N-ratio of the output signal is deteriorated. An angular velocity signal is output from the vibrating reed with no angular velocity motion input thereto. In Patent Document 2 (JP-A-2008-209215), a cut is formed in the vibrating arm for removing the vibration leakage component. The cut in the vibrating arm triggers reduction in mechanical strength of the vibrating reed. In addition, as the vibrating reed becomes smaller, the influence on the behavior of the vibrating reed by the shape accuracy of the cut increases and further improvement of processing accuracy is required. However, the improvement of processing accuracy is difficult.

SUMMARY

An advantage of some aspects of the invention is to provide a vibrating reed that may improve an S/N-ratio of an output signal while maintaining mechanical strength.

(1) An aspect of the invention relates to a vibrating reed including a base part, a drive vibrating arm and a detection vibrating arm extending from the base part, an adjustment vibrating arm extending from the base part, a first adjustment electrode provided on the adjustment vibrating arm and generating an electrical signal in first phase, a second adjustment electrode provided on the adjustment vibrating arm and generating an electrical signal in second phase opposite to the first phase, wherein the adjustment vibrating arm includes a first surface, a second surface opposite to the first surface, a first side surface and a second side surface connecting the first surface and the second surface, a first groove formed on the first surface and extending in a longitudinal direction of the adjustment vibrating arm, and having a first wall surface at the first side surface side and a second wall surface at the second side surface side, and a second groove formed on the second surface and extending in the longitudinal direction of the adjustment vibrating arm, and having a third wall surface at the first side surface side and a fourth wall surface at the second side surface side, the first adjustment electrode includes a first electrode piece provided on the first side surface, and second electrode pieces provided on the first wall surface and the third wall surface, and the second adjustment electrode includes a third electrode piece provided on the second side surface, and fourth electrode pieces provided on the second wall surface and the fourth wall surface.

This vibrating reed may be used for detection of an angular velocity. For detection of the angular velocity, vibration is excited in the drive vibrating arm. In this regard, when angular velocity motion is applied to the drive vibrating arm, the vibration direction of the drive vibrating arm changes due to action of Coriolis force. A new force component is generated in a specific direction in response to the Coriolis force. The force component causes motion of the detection vibrating arm. Accordingly, an output signal in response to the force component is output from the detection vibrating arm.

The force component causes motion of the adjustment vibrating arm at the same time. The electrical signals are respectively output from the first adjustment electrode and the second adjustment electrode in response to the motion. The inventors have found out that the component of vibration leakage contained in the output signal of the detection vibrating arm may be at least partially cancelled out by the electrical signals of the first adjustment electrode and the second adjustment electrode. When the electrical signals of the first adjustment electrode and the second adjustment electrode are superimposed on the output signal of the detection vibrating arm, the S/N-ratio of the output signal is improved. In addition, the electrical signal of the first adjustment electrode and the electrical signal of the second adjustment electrode are in anti-phase with each other, and the magnitudes of the electrical signals may be adjusted according to the relative relation between the first adjustment electrode and the second adjustment electrode. Therefore, whether the phase of vibration leakage is in in-phase or anti-phase with the output signal of the detection vibrating arm, the component of the vibration leakage may be cancelled out. When the electrical signal of the first adjustment electrode and the electrical signal of the second adjustment electrode are balanced, the influence on the output signal of the detection vibrating arm by the electrical signals may be eliminated. In addition, for adjustment of the electrical signals, it is only necessary that the shape of the first adjustment electrode or the second adjustment electrode is controlled, and the formation of cuts in the drive vibrating arm, the detection vibrating arm, and the adjustment vibrating arm may be avoided. The reduction in mechanical strength may be avoided. The cuts are not formed, and the improvement in processing accuracy is not necessarily required.

Specifically, in the vibrating reed, the adjustment vibrating arm is partially sandwiched between the first electrode piece and the second electrode pieces, and the adjustment vibrating arm is partially sandwiched between the third electrode piece and the fourth electrode pieces. As a result, the larger output signals are obtained in the first adjustment electrode and the second adjustment electrode. The adjustment range of vibration leakage may be wider. The yield may be improved.

(2) Another aspect of the invention relates to a vibrating reed including a base part, a drive vibrating arm and a detection vibrating arm extending from the base part, an adjustment vibrating arm extending from the base part, first adjustment electrodes being in contact with a piezoelectric member provided on the adjustment vibrating arm in locations apart from each other and generating electrical signals in first phase, and second adjustment electrodes being in contact with the piezoelectric member provided on the adjustment vibrating arm in locations apart from each other and generating electrical signals in second phase opposite to the first phase.

This vibrating reed may be used for detection of an angular velocity. For detection of the angular velocity, vibration is excited in the drive vibrating arm. In this regard, when angular velocity motion is applied to the drive vibrating arm, the vibration direction of the drive vibrating arm changes due to action of Coriolis force. A new force component is generated in a specific direction in response to the Coriolis force. The force component causes motion of the detection vibrating arm. Accordingly, an output signal in response to the force component is output from the detection vibrating arm.

The force component causes motion of the adjustment vibrating arm at the same time. The electrical signals are respectively output from the first adjustment electrode and the second adjustment electrode in response to the motion. The inventors have found out that the component of vibration leakage contained in the output signal of the detection vibrating arm may be at least partially cancelled out by the electrical signals of the first adjustment electrode and the second adjustment electrode. When the electrical signals of the first adjustment electrode and the second adjustment electrode are superimposed on the output signal of the detection vibrating arm, the S/N-ratio of the output signal is improved. In addition, the electrical signal of the first adjustment electrode and the electrical signal of the second adjustment electrode are in anti-phase with each other, and the magnitudes of the electrical signals may be adjusted according to the relative relation between the first adjustment electrode and the second adjustment electrode. Therefore, whether the phase of vibration leakage is in in-phase or anti-phase with the output signal of the detection vibrating arm, the component of the vibration leakage may be cancelled out. When the electrical signal of the first adjustment electrode and the electrical signal of the second adjustment electrode are balanced, the influence on the output signal of the detection vibrating arm by the electrical signals may be eliminated. In addition, for adjustment of the electrical signals, it is only necessary that the shape of the first adjustment electrode or the second adjustment electrode is controlled, and the formation of cuts in the drive vibrating arm, the detection vibrating arm, and the adjustment vibrating arm may be avoided. The reduction in mechanical strength may be avoided. The cuts are not formed, and the improvement in processing accuracy is not necessarily required.

(3) The electrical signal of the adjustment vibrating arm may be in anti-phase with an electrical signal of vibration leakage of the detection vibrating arm. The electrical signal of the adjustment vibrating arm may cancel out the electrical signal of the vibration leakage. Accordingly, the S/N-ratio of the output signal may be improved.

(4) A detection electrode that generates an electrical signal in response to a physical quantity applied to the drive vibrating arm may be provided on the detection vibrating arm, the first adjustment electrode and the detection electrode may be electrically connected, and the second adjustment electrode and the detection electrode may be electrically connected. The electrical signal of the adjustment vibrating arm may be superimposed on the output signal of the detection vibrating arm. The magnitude of the electrical signal is adjusted. As a result of adjustment, the electrical signal of the adjustment vibrating arm may cancel out the component of vibration leakage. Accordingly, the S/N-ratio of the output signal may be improved.

(5) The vibrating reed may be incorporated and used in a gyro sensor. The gyro sensor may have the vibrating reed.

(6) The vibrating reed may be incorporated and used in an electronic apparatus. The electronic apparatus may have the vibrating reed.

(7) The vibrating reed may be incorporated and used in a mobile unit. The mobile unit may have the vibrating reed.

BRIEF DESCRIPTION OF THE DRAWINGS

The invention will be described with reference to the accompanying drawings, wherein like numbers reference like elements.

FIG. 10A is a graph schematically showing a relationship among vibration leakage, the detection signal of the first vibrating arm, and the detection signal of the third vibrating arm, FIG. 10B is an enlarged vertical sectional view of the first vibrating arm, and FIG. 10C is an enlarged vertical sectional view of the third vibrating arm.

FIG. 11A is a graph schematically showing a relationship between detection signals of the third vibrating arm cancelled out each other, and FIG. 11B is an enlarged vertical sectional view of the third vibrating arm.

FIG. 12 is an enlarged vertical sectional view schematically showing a structure of a third vibrating arm used for a gyro sensor according to a second embodiment.

DESCRIPTION OF EXEMPLARY EMBODIMENTS

As below, one embodiment of the invention will be explained with reference to the accompanying drawings. Note that the embodiment to be explained does not unduly limit the intention described in the appended claims is, and not all of the configurations explained in the embodiment are not necessarily essential as solving means in the invention.

(1) Configuration of Gyro Sensor According to First Embodiment

Figure 1:
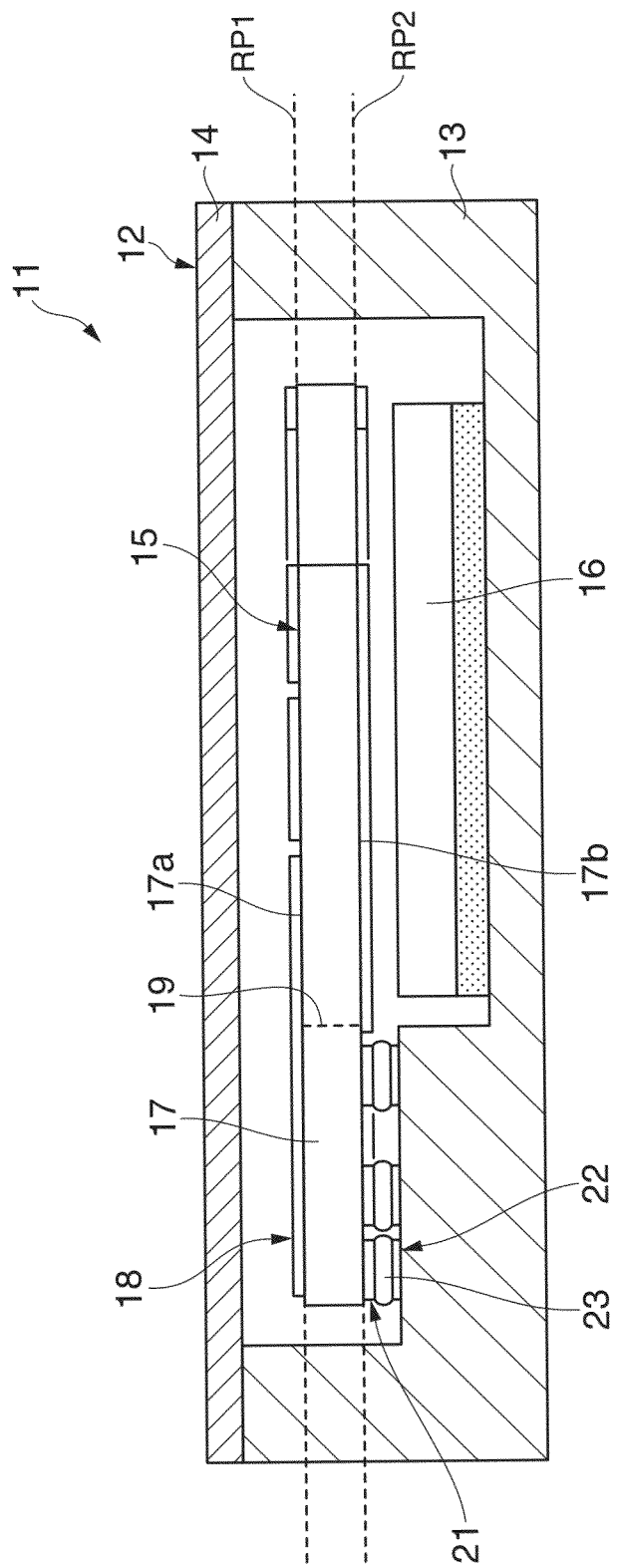
FIG. 1 is a vertical sectional view schematically showing a configuration of a gyro sensor according to a first embodiment.

FIG. 1 schematically shows a configuration of a gyro sensor 11 according to the first embodiment. The gyro sensor 11 includes a box-shaped container 12, for example. The container 12 includes a container main body 13 and a lid member 14. The opening of the container main body 13 is air-tightly covered by the lid member 14. The internal space of the container 12 may be sealed in vacuum, for example. The container 12 functions as a rigid body. At least the lid member 14 may be formed from a conductor. When the lid member 14 is grounded, the lid member 14 may exert a shield effect for electromagnetic wave.

A vibrating reed 15 and an IC (integrated circuit) chip 16 are housed in the container 12. The vibrating reed 15 and the IC chip 16 are provided within the internal space of the container 12. The vibrating reed 15 includes a main body 17 and a conducting film 18. The conducting film 18 is stacked on the surfaces of the main body 17. The conducting film 18 may be formed using a conducting material such as gold (Au), copper (Cu), or other metals. The conducting film 18 may be formed by a thin film or a thick film. As clearly seen from FIG. 1, the main body 17 of the vibrating reed 15 has a front surface 17a and a rear surface 17b. The front surface 17a spreads within a first reference plane RP1. The rear surface 17b spreads within a second reference plane RP2. The second reference plane RP2 spreads in parallel to the first reference plane RP1. Here, the entire main body 17 is formed by one piezoelectric member. For the piezoelectric member, for example, quartz may be used.

The vibrating reed 15 is cantilevered by the container main body 13. For cantilever, a fixing part 19 is partitioned at one end of the main body 17. A group of connecting terminals 21 are provided in the fixing part 19. The group of connecting terminals 21 are formed by a part of the conducting film 18 spreading on the rear surface 17b. The group of connecting terminals 21 include a plurality of connecting terminals, i.e., pads made of a conducting material. The details of the connecting terminals will be described later. On the other hand, a group of conducting terminals 22 are provided on the bottom plate of the container main body 13. The group of conducting terminals 22 include a plurality of connecting terminals, i.e., pads made of a conducting material. The group of connecting terminals 21 of the vibrating reed 15 are bonded to the group of conducting terminals 22 on the bottom plate. For bonding, a conducting bonding material 23 such as solder bump or gold bump, for example, may be used. In this manner, the vibrating reed 15 is fixed to the bottom plate of the container main body 13 in the fixing part 19. The group of conducting terminals 22 are connected to the IC chip 16 via wires (not shown) of the conducting film 18. The IC chip 16 may be bonded to the bottom plate of the container main body 13, for example.

Figure 2:
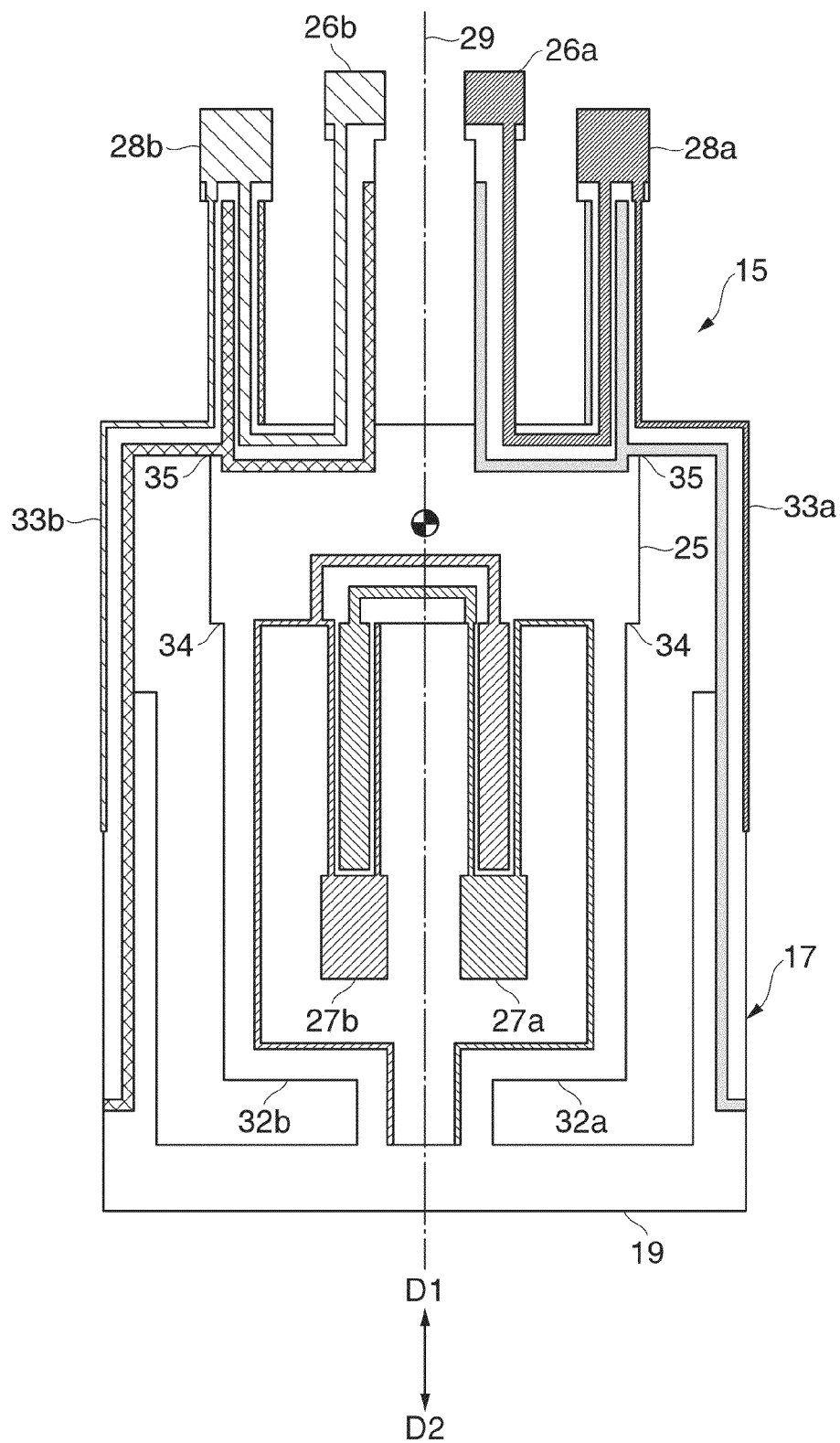
FIG. 2 is an enlarged plan view schematically showing a structure of a vibrating reed.

As shown in FIG. 2, the main body 17 of the vibrating reed 15 has a base part 25, a pair of first vibrating arms 26a, 26b, a pair of second vibrating arms 27a, 27b, and a pair of third vibrating arms 28a, 28b. The front surface 17a and the rear surface 17b of the vibrating reed 15 correspond to front surfaces and rear surfaces of the first vibrating arms 26a, 26b, front surfaces and rear surfaces of the second vibrating arms 27a, 27b, and front surfaces and rear surfaces of the third vibrating arms 28a, 28b, respectively. The front surface 17a and the rear surface 17b of the vibrating reed 15 specify the vibration directions excited by drive signals, i.e., the excitation directions of the second vibrating arms 27a, 27b as will be described later.

The pair of first vibrating arms 26a, 26b extend from the base part 25 in a first direction D1. The first vibrating arms 26a, 26b are cantilevered by the base part 25. The first vibrating arms 26a, 26b extend in parallel to each other. The first vibrating arms 26a, 26b are formed in plane symmetry with respect to a symmetry surface 29 containing the center of gravity of the base part 25 and being orthogonal to the first and second reference planes RP1, RP2. Here, the pair of first vibrating arms 26a, 26b function as a pair of detecting arms. The base part 25 has predetermined rigidity.

The pair of second vibrating arms 27a, 27b extend from the base part 25 in a second direction D2. The second direction D2 is opposite to the first direction D1. The second vibrating arms 27a, 27b are cantilevered by the base part 25. The second vibrating arms 27a, 27b extend in parallel to each other. The second vibrating arms 27a, 27b are formed in plane symmetry with respect to the symmetry surface 29 containing the center of gravity of the base part 25 and being orthogonal to the first and second reference planes RP1, RP2. Here, the pair of second vibrating arms 27a, 27b function as a pair of driving arms.

The pair of third vibrating arms 28a, 28b extend from the base part 25 in the first direction D1. The third vibrating arms 28a, 28b are cantilevered by the base part 25. The third vibrating arms 28a, 28b extend in parallel to each other. The third vibrating arms 28a, 28b are formed in plane symmetry with respect to the symmetry surface 29 containing the center of gravity of the base part 25 and being orthogonal to the first and second reference planes RP1, RP2. Here, the pair of third vibrating arms 28a, 28b function as a pair of adjustment vibrating arms. The pair of detecting arms are provided in a space between the adjustment vibrating arms.

The main body 17 of the vibrating reed 15 has at least a pair of first suspended arms 32a, 32b and a pair of second suspended arms 33a, 33b. Here, the pair of first suspended arms 32a, 32b are partitioned in the main body 17. The first suspended arms 32a, 32b extend from the fixing part 19 in the first direction D1 on the sides of the pair of second vibrating arms 27a, 27b, respectively. The ends of the first suspended arms 32a, 32b are respectively connected to first connecting parts 34 of the base part 25. The two first connecting parts 34 are located on the sides of the pair of second vibrating arms 27a, 27b.

The second suspended arms 33a, 33b extend from the fixing part 19 in the first direction D1 on the sides of the pair of second vibrating arms 27a, 27b and the pair of first suspended arms 32a, 32b, respectively. The ends of the second suspended arms 33a, 33b are connected to second connecting parts 35 of the base part 25. The second connecting parts 35 are located at the downstream of the first connecting parts 34 in the first direction D1.

Figure 3:
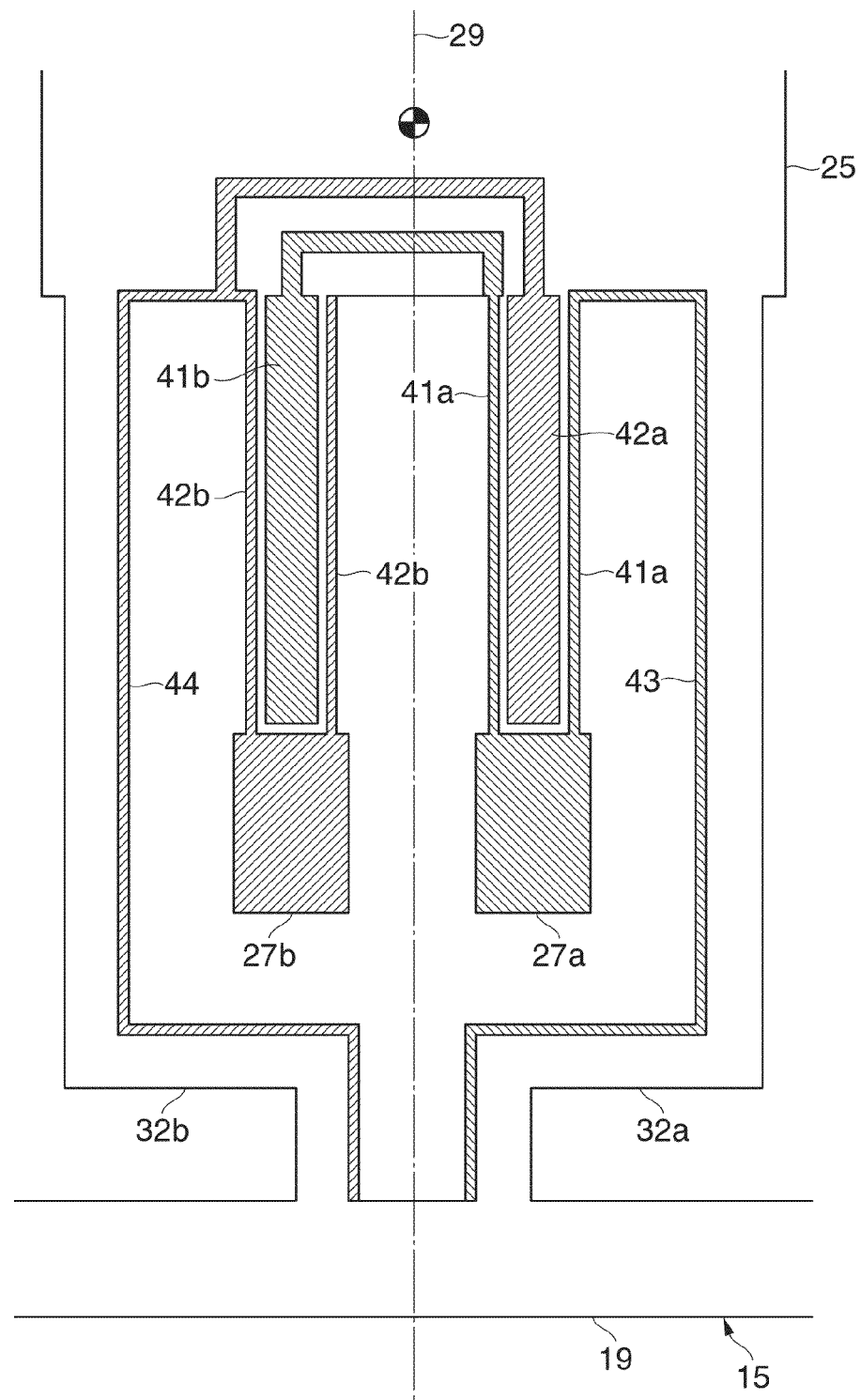
FIG. 3 is an enlarged partial plan view schematically showing a configuration of a front surface of a second vibrating arm.

As shown in FIG. 3, the conducting film 18 forms two pairs of first drive electrodes 41a, 41b and two pairs of second drive electrodes 42a, 42b. The first pair of first drive electrodes 41a are fixed to one second vibrating arm 27a. The first drive electrodes 41a spread on the side surfaces of the second vibrating arm 27a. The second vibrating arm 27a is sandwiched between the first drive electrodes 41a. The first drive electrodes 41a are connected to each other at the free end side of the second vibrating arm 27a. The second pair of first drive electrodes 41b are fixed to the other second vibrating arm 27b. The first drive electrodes 41b spread on the front surface 17a and the rear surface 17b of the second vibrating arm 27b. The second vibrating arm 27b is sandwiched between the first drive electrodes 41b. The second pair of first drive electrodes 41b are connected to the first pair of first drive electrodes 41a in the base part 25.

The first pair of second drive electrodes 42a are fixed to the one second vibrating arm 27a. The second drive electrodes 42a spread on the front surface 17a and the rear surface 17b of the second vibrating arm 27a. The second vibrating arm 27a is sandwiched between the second drive electrodes 42a. The second pair of second drive electrodes 42b are fixed to the other second vibrating arm 27b. The second drive electrodes 42b spread on the side surfaces of the second vibrating arm 27b. The second vibrating arm 27b is sandwiched between the second drive electrodes 42b. The second drive electrodes 42b are connected to each other at the free end side of the second vibrating arm 27b. The second pair of second drive electrodes 42b are connected to the first pair of second drive electrodes 42a in the base part 25. When electric fields are applied between the first drive electrodes 41a, 41b and the second drive electrodes 42a, 42b, the second vibrating arms 27a, 27b are deformed.

The conducting film 18 forms a first driving wire 43 and a second driving wire 44. The first driving wire 43 is fixed to one first suspended arm 32a. The first driving wire 43 extends over the entire length of the first suspended arm 32a on the first suspended arm 32a. The first driving wire 43 is connected to the first drive electrodes 41a, 41b. The second driving wire 44 is fixed to the other first suspended arm 32b. The second driving wire 44 extends over the entire length of the first suspended arm 32b on the first suspended arm 32b. The second driving wire 44 is connected to the second drive electrodes 42a, 42b.

Figure 4:
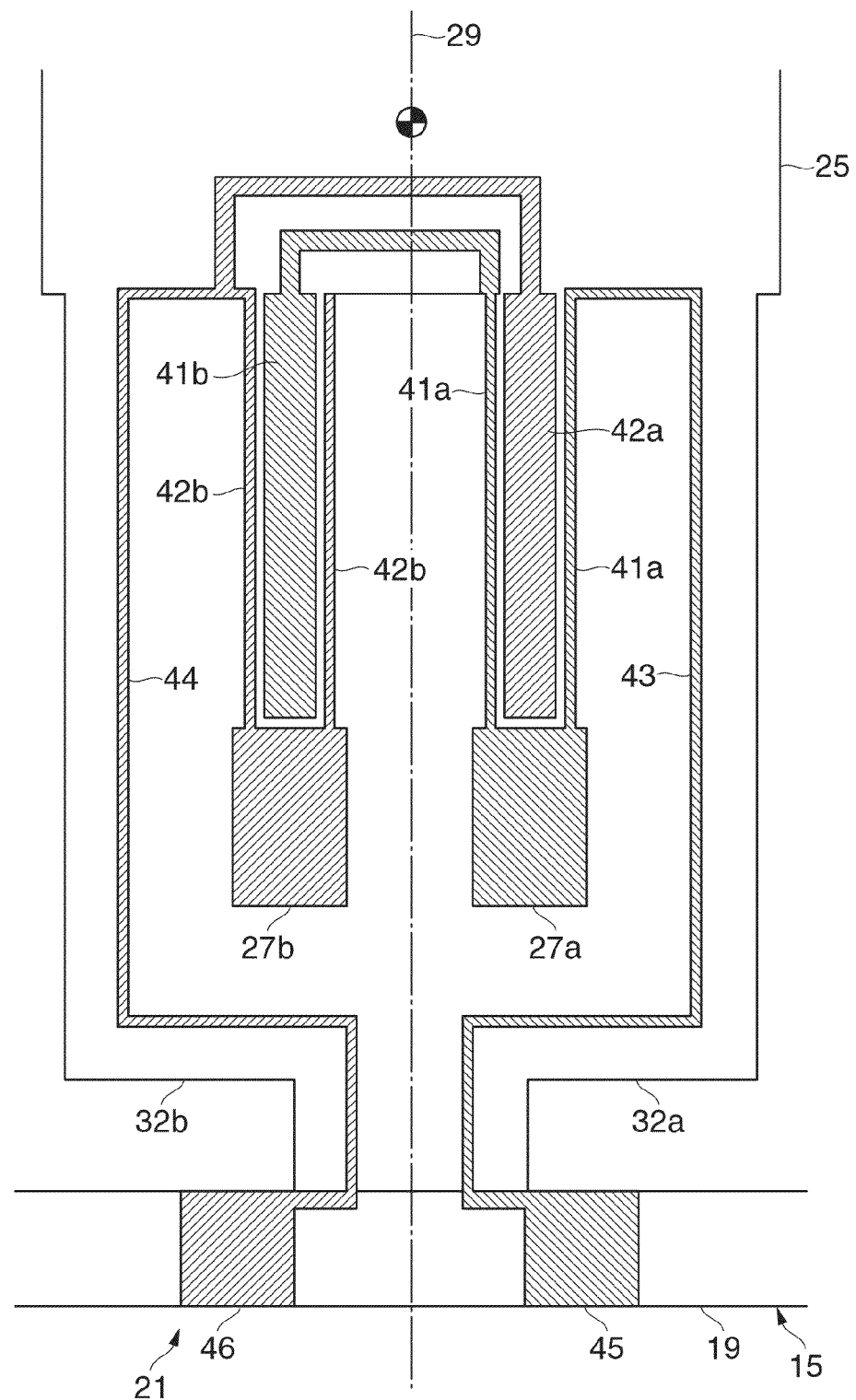
FIG. 4 is an enlarged perspective plan view schematically showing a configuration of a rear surface of the second vibrating arm from the front side.

As shown in FIG. 4, the group of connecting terminals 21 include a first driving terminal 45 and a second driving terminal 46. The first driving terminal 45 and the second driving terminal 46 are respectively fixed to the rear surface 17b of the fixing part 19. The first driving terminal 45 is connected to the first driving wire 43. The second driving terminal 46 is connected to the second driving wire 44. Drive signals may be supplied from the first driving terminal 45 and the second driving terminal 46 to the first drive electrodes 41a, 41b and the second drive electrodes 42a, 42b.

Figure 5:
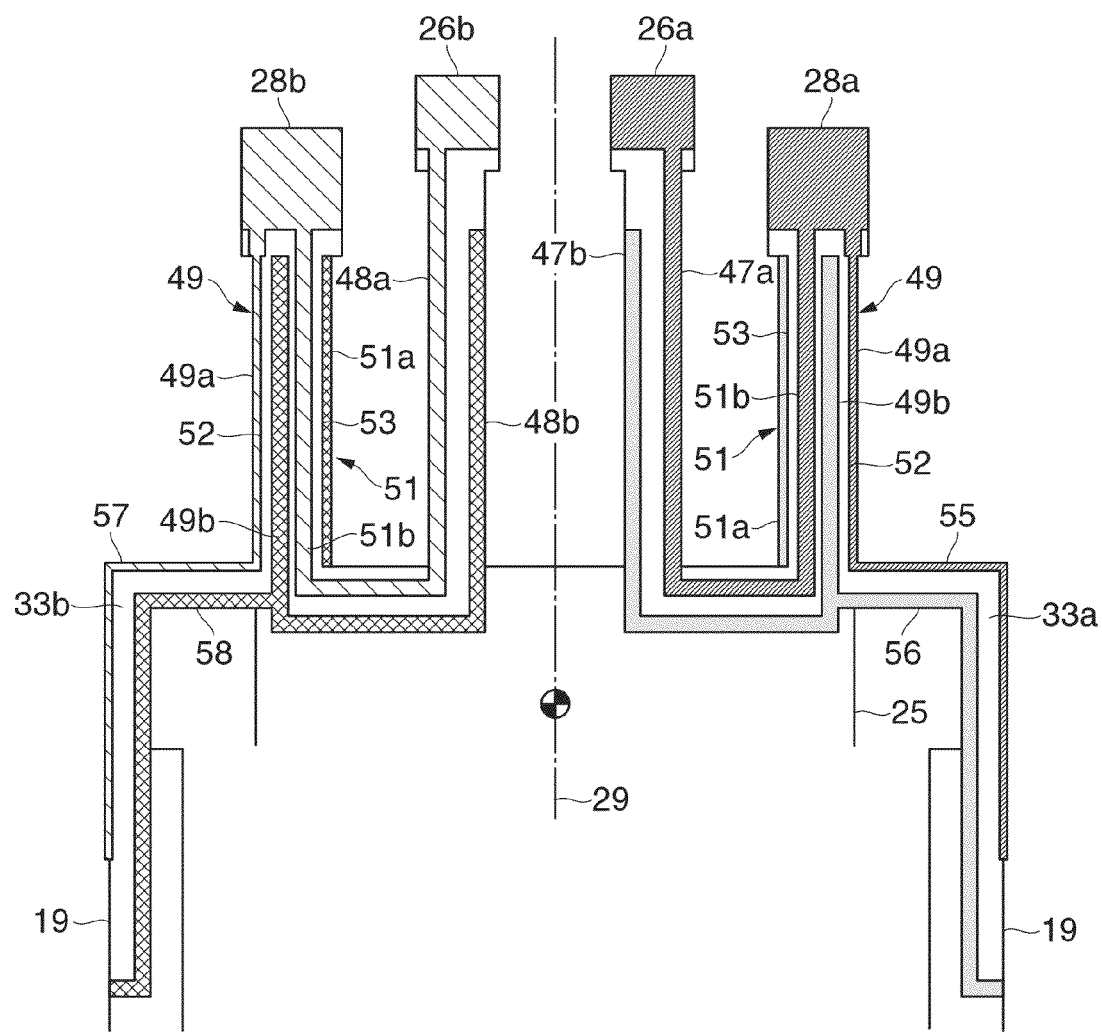
FIG. 5 is an enlarged partial plan view schematically showing a configuration of front surfaces of a first vibrating arm and a third vibrating arm.

The conducting film 18 forms two sets of pairs of first detection electrodes (signal electrodes 47a and ground electrodes 47b) and two sets of pairs of second detection electrodes (signal electrodes 48a and ground electrodes 48b). As shown in FIG. 5, the signal electrode 47a and the ground electrode 47b of the pair of first detection electrodes are fixed to one first vibrating arm 26a. The signal electrode 47a of the pair of first detection electrodes extends from the base of the first vibrating arm 26a toward the free end on the front surface 17a of the first vibrating arm 26a. The ground electrode 47b of the pair of first detection electrodes extends from the base of the first vibrating arm 26a toward the free end on the front surface 17a of the first vibrating arm 26a.

The signal electrode 48a and the ground electrode 48b of the pair of second detection electrodes are fixed to the other first vibrating arm 26b. The signal electrode 48a of the pair of second detection electrodes extends from the base of the first vibrating arm 26b toward the free end on the front surface 17a of the first vibrating arm 26b. The ground electrode 48b of the pair of first detection electrodes extends from the base of the first vibrating arm 26b toward the free end on the front surface 17a of the first vibrating arm 26b.

The conducting film 18 forms two sets of pairs of first adjustment electrodes 49 and two sets of pairs of second adjustment electrodes 51. The pair of first adjustment electrodes 49 are fixed to the third vibrating arm 28a. The pair of first adjustment electrodes 49 include a first electrode piece 49a and a pair of second electrode pieces 49b. The first electrode piece 49a is provided on a first side surface 52 of the third vibrating arm 28a. The first side surface 52 is specified in parallel to the symmetry surface 29 and connects the front surface (first surface) 17a and the rear surface (second surface) 17b of the third vibrating arm 28a to each other. The first electrode piece 49a extends from the base of the third vibrating arm 28a toward the free end over the entire length of the third vibrating arm 28a.

One second electrode piece 49b is provided on the front surface 17a of the third vibrating arm 28a. The second electrode piece 49b extends from the base of the third vibrating arm 28a toward the free end over the entire length of the third vibrating arm 28a. The second electrode piece 49b is adjacent to the first electrode piece 49a with the first side surface 52 and the edge line of the front surface 17a in between. A gap is partitioned between the first electrode piece 49a and the second electrode piece 49b along the edge line. Currents are drawn from the first electrode piece 49a and the second electrode piece 49b in response to the deformation of the third vibrating arm 28a.

The pair of second adjustment electrodes 51 are similarly connected to the third vibrating arm 28a. The pairs of second adjustment electrodes 51 include a third electrode piece 51a and a pair of fourth electrode pieces 51b. The third electrode piece 51a is provided on a second side surface 53 of the third vibrating arm 28a. The second side surface 53 is specified in parallel to the symmetry surface 29 and connects the front surface (first surface) 17a and the rear surface (second surface) 17b of the third vibrating arm 28a to each other. The second side surface 53 is located at the opposite side (rear side) to the first side surface 52. The third electrode piece 51a extends from the base of the third vibrating arm 28a toward the free end over the entire length of the third vibrating arm 28a. The third electrode piece 51a is opposed to the first electrode piece 49a with the third vibrating arm 28a in between.

One fourth electrode piece 51b is provided on the front surface 17a of the third vibrating arm 28a. The fourth electrode piece 51b extends from the base of the third vibrating arm 28a toward the free end over the entire length of the third vibrating arm 28a. The fourth electrode piece 51b is adjacent to the third electrode piece 51a with the second side surface 53 and the edge line of the front surface 17a in between. A gap is partitioned between the third electrode piece 51a and the fourth electrode piece 51b along the edge line. Currents are drawn from the third electrode piece 51a and the fourth electrode piece 51b in response to the deformation of the third vibrating arm 28a.

Similarly, the pair of first adjustment electrodes 49 and the pair of second adjustment electrodes 51 are fixed to the other third vibrating arm 28b. For fixing, the first side surface 52 and the second side surface 53 are specified on the third vibrating arm 28b like the third vibrating arm 28a. The first electrode piece 49a and the third electrode piece 51a are fixed to the first side surface 52 and the second side surface 53 of the third vibrating arm 28b, respectively. The second electrode piece 49b and the fourth electrode piece 51b are fixed to the front surface (first surface) 17a of the third vibrating arm 28b.

The conducting film 18 forms a first detection wire 55 and a second detection wire 56. The first detection wire 55 and the second detection wire 56 are fixed to the base 25 and one second suspended arm 33a. The first electrode piece 49a and the fourth electrode piece 51b of the third vibrating arm 28a are electrically connected to the first detection wire 55. The second electrode piece 49b and the third electrode piece 51a are electrically connected to the second detection wire 56. Similarly, the conducting film 18 forms a third detection wire 57 and a fourth detection wire 58. The third detection wire 57 and the fourth detection wire 58 are fixed to the base 25 and the other second suspended arm 33b. The first electrode piece 49a and the fourth electrode piece 51b of the third vibrating arm 28b are electrically connected to the third detection wire 57. The second electrode piece 49b and the third electrode piece 51a are electrically connected to the fourth detection wire 58.

Figure 6:
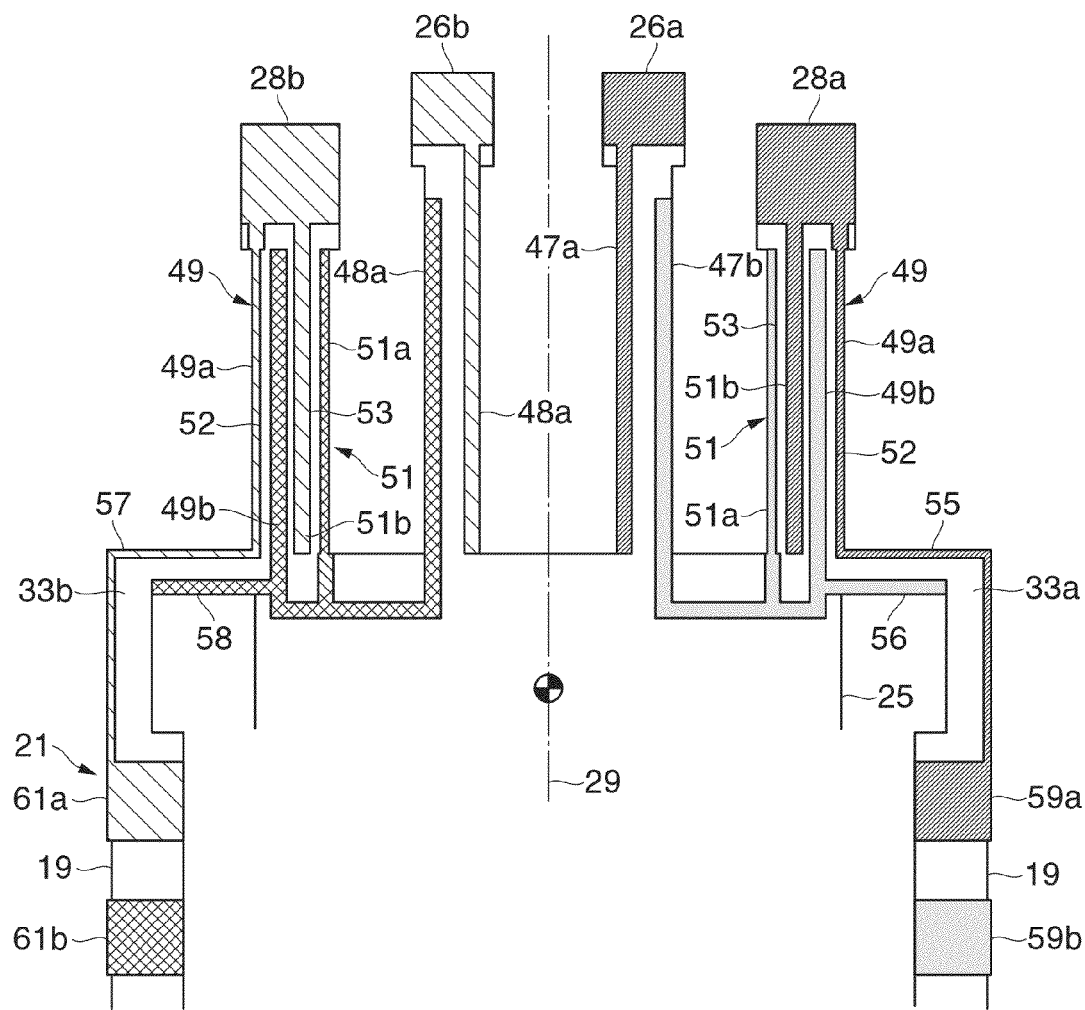
FIG. 6 is an enlarged perspective partial plan view schematically showing a configuration of rear surfaces of the first vibrating arm and the third vibrating arm from the front side.

As shown in FIG. 6, the signal electrode 47a and the ground electrode 47b of the pair of first detection electrodes are similarly provided on the rear surface 17b of the first vibrating arm 26a. The signal electrode 47a and the ground electrode 47b extend from the base of the first vibrating arm 26a toward the free end. The signal electrode 47a on the rear surface 17b may be connected to the signal electrode 47a on the front surface 17a at the free end of the first vibrating arm 26a. The ground electrode 47b on the rear surface 17b may be connected to the ground electrode 47b on the front surface 17a in the base part 25. Currents are drawn from the signal electrodes 47a and the ground electrodes 47b in response to the deformation of the first vibrating arm 26a.

The signal electrode 48a and the ground electrode 48b are similarly fixed to the rear surface 17b of the other first vibrating arm 26b. The signal electrode 48a and the ground electrode 48b extend from the base of the first vibrating arm 26b toward the free end. The signal electrode 48a on the rear surface 17b may be connected to the signal electrode 48a on the front surface 17a at the free end of the first vibrating arm 26b. The ground electrode 48b on the rear surface 17b may be connected to the ground electrode 48b on the front surface 17a in the base part 25. Currents are drawn from the signal electrodes 48a and the ground electrodes 48b in response to the deformation of the first vibrating arm 26b.

The other second electrode piece 49b is similarly provided on the rear surface 17b of the third vibrating arm 28a. The second electrode piece 49b extends from the base of the third vibrating arm 28a toward the free end over the entire length of the third vibrating arm 28a. The second electrode piece 49b is adjacent to the first electrode piece 49a with the first side surface 52 and the edge line of the rear surface 17b in between. A gap is partitioned between the first electrode piece 49a and the second electrode piece 49b along the edge line. Currents are drawn from the first electrode piece 49a and the second electrode piece 49b in response to the deformation of the third vibrating arm 28a. Similarly, the other fourth electrode piece 51b is provided on the rear surface 17b of the third vibrating arm 28a. The fourth electrode piece 51b extends from the base of the third vibrating arm 28a toward the free end over the entire length of the third vibrating arm 28a. The fourth electrode piece 51b is adjacent to the third electrode piece 51a with the second side surface 53 and the edge line of the rear surface 17b in between. A gap is partitioned between the third electrode piece 51a and the fourth electrode piece 51b along the edge line. Currents are drawn from the third electrode piece 51a and the fourth electrode piece 51b in response to the deformation of the third vibrating arm 28a.

The group of connecting terminals 21 include a pair of first detection terminals (a signal terminal 59a and a ground terminal 59b) and a pair of second detection terminals (a signal terminal 61a and a ground terminal 61b). The signal terminal 59a and the ground terminal 59b of the first detection terminal and the signal terminal 61a and the ground terminal 61b of the second detection terminal are fixed to the fixing part 19. The signal terminal 59a of the first detection terminal is electrically connected to the first detection wire 55. The ground terminal 59b of the first detection terminal is electrically connected to the second detection wire 56. The signal terminal 61a of the second detection terminal is electrically connected to the third detection wire 57. The ground terminal 61b of the second detection terminal is electrically connected to the fourth detection wire 58. The ground terminal 59b is provided between the signal terminal 59a and the first driving terminal 45. Similarly, the ground terminal 61b is provided between the signal terminal 61a and the second driving terminal 46.

(2) Movement of Gyro Sensor According to First Embodiment

Figure 7:
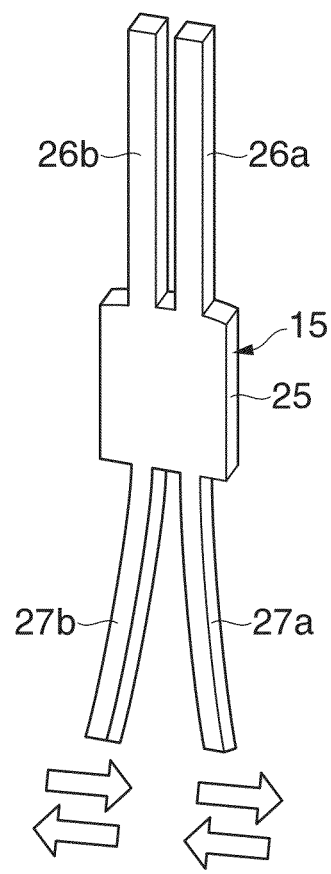
FIG. 7 is a perspective view of the vibrating reed schematically showing vibration of the second vibrating arm, i.e., a drive vibrating arm.

Next, the movement of the gyro sensor 11 will be briefly explained. As shown in FIG. 7, for detection of an angular velocity, vibration is excited in the second vibrating arms 27a, 27b. For excitation of vibration, drive signals are input from the first driving terminal 45 and the second driving terminal 46 to the vibrating reed 15. As a result, electric fields act on the main body 17 of the vibrating reed 15 between the first drive electrodes 41a, 41b and the second drive electrodes 42a, 42b. When a waveform with a specific frequency is input, the second vibrating arms 27a, 27b flexurally vibrate between the first reference plane RP1 and the second reference plane RP2. They move repeatedly away from each other and close to each other.

Figure 8:
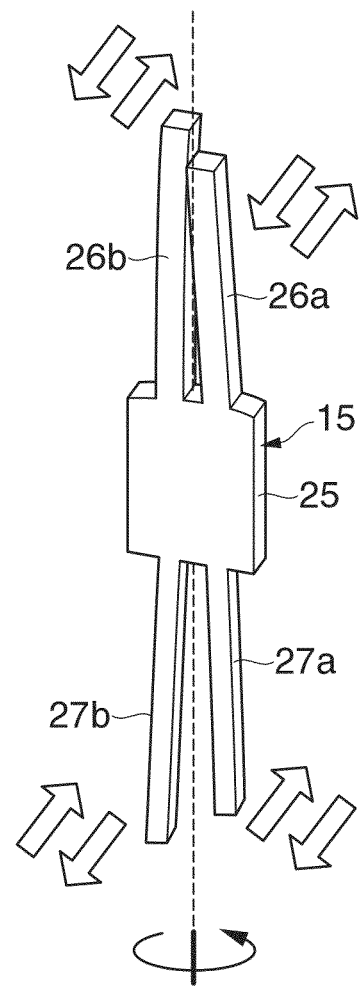
FIG. 8 is a perspective view of the vibrating reed schematically showing vibration of the first vibrating arm, i.e., a detection vibrating arm.

When angular velocity motion is applied to the gyro sensor 11, as shown in FIG. 8, the vibration directions of the second vibrating arms 27a, 27b change due to action of Coriolis force. The so-called walk-mode excitation is caused. Concurrently, a new force component is generated in parallel to the symmetry surface 29 in response to the Coriolis force. The second vibrating arms 27a, 27b flexurally vibrate in parallel to the symmetry surface 29. The second vibrating arms 27a, 27b swing around the center of gravity of the vibration.

The walk-mode excitation of the second vibrating arms 27a, 27b propagates from the base part 25 to the first vibrating arms 26a, 26b. As a result, motion of the first vibrating arms 26a, 26b is caused according to the force component in parallel to the symmetry surface 29. The first vibrating arms 26a, 26b flexurally move in parallel to the symmetry surface 29. The first vibrating arms 26a, 26b swing around the center of gravity of the vibration. In response to the flexural motion, electric fields are generated in the first vibrating arms 26a, 26b according to the piezoelectric effect, and electric charge is generated. The flexural motion of the first vibrating arm 26a produces a potential difference between the signal electrode 47a and the ground electrode 47b of the pair of first detection electrodes. Similarly, the flexural motion of the first vibrating arm 26b produces a potential difference between the signal electrode 48a and the ground electrode 48b of the pair of second detection electrodes.

The walk-mode excitation of the second vibrating arms 27a, 27b propagates from the base part 25 to the third vibrating arms 28a, 28b. As a result, the motion of the third vibrating arms 28a, 28b is caused. In response to the motion, electrical signals are respectively output from the pairs of first adjustment electrodes 49 and the pairs of second adjustment electrodes 51.

Figure 9A:
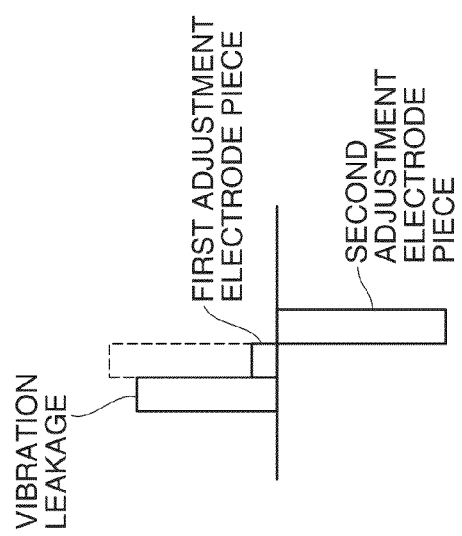
FIG. 9A is a graph schematically showing a relationship among vibration leakage, a detection signal of the first vibrating arm, and a detection signal of the third vibrating arm.
Figure 9B:
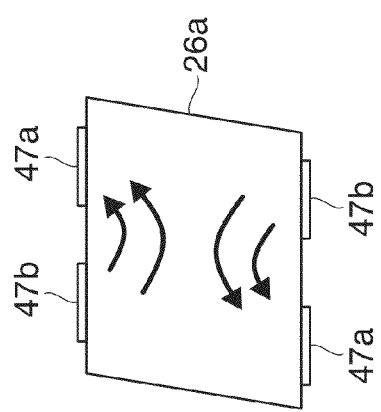
FIG. 9B is an enlarged vertical sectional view of the first vibrating arm.
Figure 9C:
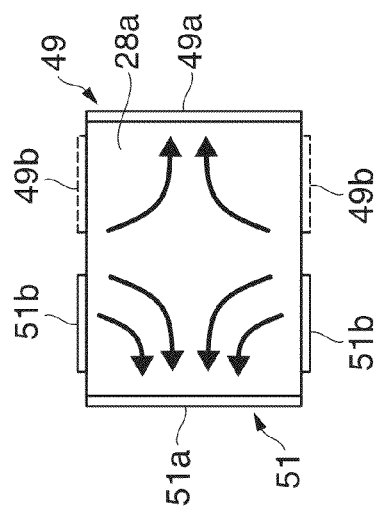
FIG. 9C is an enlarged vertical sectional view of the third vibrating arm.

As shown in FIGS. 9A to 9C, when the shapes of the first vibrating arms 26a, 26b deviate from the designed shapes according to the processing errors, for example, in the output signals from the first vibrating arms 26a, 26b, components of vibration leakage are superimposed on the force components of the Coriolis force. Concurrently, the electrical signals of the pair of first adjustment electrodes 49 and the electrical signals of the pair of second adjustment electrodes 51 are superimposed on the output signals of the first vibrating arms 26a, 26b. The magnitudes of the electrical signals are adjusted. As a result of the adjustment, the electrical signals of the pairs of first and second adjustment electrodes 49, 51 may cancel out the components of vibration leakage. Accordingly, the S/N-ratio of the output signals is improved. For adjustment of the electrical signals, the shapes of the pair of first adjustment electrodes 49 and the pair of second adjustment electrodes 51 are adjusted in advance. The volume of the piezoelectric member intervening between the first electrode piece 49a and the second electrode pieces 49b and the distances between the first electrode piece 49a and the second electrode pieces 49b are adjusted. The volume of the piezoelectric member intervening between the third electrode piece 51a and the fourth electrode pieces 51b and the distances between the third electrode piece 51a and the fourth electrode pieces 51b are adjusted. The formation of cuts in the first vibrating arms 26a, 26b, the second vibrating arms 27a, 27b, and the third vibrating arms 28a, 28b may be avoided. The reduction in mechanical strength may be avoided. The cuts are not formed, and improvement in processing accuracy is not necessarily required.

In addition, the electrical signals of the pair of first adjustment electrodes 49 and the electrical signals of the pair of second adjustment electrodes 51 are in anti-phase with each other, and the magnitudes of the electrical signals may be adjusted according to the relative relations between the pair of first adjustment electrodes 49 and the pair of second adjustment electrodes 51. Therefore, as clearly seen from FIGS. 9A to 9C and 10A to 10C, whether the phase of the vibration leakage is in-phase or anti-phase with the output signals of the first vibrating arms 26a, 26b, the components of vibration leakage may be cancelled out. When the electrical signals of the pair of first adjustment electrodes 49 and the electrical signals of the pair of second adjustment electrodes 51 are cancelled out by each other, the influence on the output signals of the first vibrating arms 26a, 26b by the electrical signals may be eliminated as shown in FIGS. 11A and 11B.

(3) Method of Manufacturing Gyro Sensor According to First Embodiment

For manufacture of the gyro sensor 11, the vibrating reed 15 is manufactured. The main body 17 of the vibrating reed 15 is cut out from quartz. The conducting film 18 is formed on the main body 17. The conducting film 18 is formed in a designed pattern. For formation of the conducting film 18, for example, a photolithography technology may be used.

The container 12 is prepared. The IC chip 16 is fixed within the container main body 13. Subsequently, the vibrating reed 15 is fixed within the container main body 13. The group of connecting terminals 21 are bonded to the group of connecting terminals 22. The first and second driving terminals 45, 46, the first detection terminals 59a, 59b, and the second detection terminals 61a, 61b are respectively received by corresponding connecting terminals. Thus, the vibrating reed 15 is electrically connected to the IC chip 16.

Here, tuning of the gyro sensor 11 is performed. In the tuning, a control signal is supplied to the IC chip 16. The IC chip 16 starts detection operation of the angular velocity. As described above, vibration is excited in the second vibrating arms 27a, 27b. When no angular velocity motion acts, no Coriolis force is generated in the second vibrating arms 27a, 27b. In this regard, if the angular velocity="0" is detected in the gyro sensor 11, the opening of the container main body 13 is air-tightly covered by the lid member 14. The internal space of the container 12 is sealed. The manufacture of the gyro sensor 11 is completed.

If the angular velocity="0" is not detected in the gyro sensor 11, vibration leakage is assumed. In this case, the shapes of the second electrode pieces 49b of the pairs of first adjustment electrodes 49 and the fourth electrode pieces 51b of the pairs of second adjustment electrodes 51 are adjusted in response to the amount of measured electric charge. For example, parts of the electrode pieces 49b, 51b are removed or cut off with a laser. As a result, laser signature is formed around the electrode pieces 49b, 51b. As a result of the adjustment of the second electrode pieces 49b and the fourth electrode pieces 51b, if the angular velocity="0" is not detected in the gyro sensor 11, the opening of the container main body 13 is air-tightly covered by the lid member 14. The internal space of the container 12 is sealed. The manufacture of the gyro sensor 11 is completed.

(4) Gyro Sensor According to Second Embodiment

In the gyro sensor 11 according to the second embodiment, for the vibrating reed 15, third vibrating arms 63 are used in place of the above described third vibrating arms 28a, 28b. As shown in FIG. 12, a first groove 64 is formed on the front surface (first surface) 17a of the third vibrating arm 63 and a second groove 65 is formed on the rear surface (second surface) 17b of the third vibrating arm 63. The first groove 64 and the second groove 65 extend from the base of the third vibrating arm 63 toward the free end in the longitudinal direction of the third vibrating arm 63. The first groove 64 and the second groove 65 may be formed as long grooves extending over the entire length of the third vibrating arm 63.

The first groove 64 has a first wall surface 66a and a second wall surface 66b. The first wall surface 66a and the second wall surface 66b face each other. The first wall surface 66a sandwiches the piezoelectric member of the third vibrating arm 63 between the first side surface 52 and itself. The second wall surface 66b sandwiches the piezoelectric member of the third vibrating arm 63 between the second side surface 53 and itself. The first wall surface 66a and the second wall surface 66b may spread in parallel to the symmetry surface 29.

The second groove 65 has a third wall surface 67a and a fourth wall surface 67b. The third wall surface 67a and the fourth wall surface 67b face each other. The third wall surface 67a sandwiches the piezoelectric member of the third vibrating arm 63 between the first side surface 52 and itself. The fourth wall surface 67b sandwiches the piezoelectric member of the third vibrating arm 63 between the second side surface 53 and itself. The third wall surface 67a and the fourth wall surface 67b may spread in parallel to the symmetry surface 29.

To the individual third vibrating arms 63, a pair of first adjustment electrodes 68 and a pair of second adjustment electrodes 69 are fixed. The pair of first adjustment electrodes 68 include a first electrode piece 68a and a pair of second electrode pieces 68b. The first electrode piece 68a is provided on the first side surface 52 of the third vibrating arm 63. The first electrode piece 68a extends from the base of the third vibrating arm 63 toward the free end over the entire length of the third vibrating arm 68. The first electrode piece 68a is electrically connected to the first detection wire 55 or the third detection wire 57.

One second electrode piece 68b is provided on the first wall surface 66a inside of the first groove 64. The second electrode piece 68b extends from the base of the third vibrating arm 63 toward the free end over the entire length of the first groove 64. The other second electrode piece 68b is provided on the third wall surface 67a inside of the second groove 65. The second electrode piece 68b extends from the base of the third vibrating arm 63 toward the free end over the entire length of the second groove 65. The second electrode piece 68b is electrically connected to the second detection wire 56 or the fourth detection wire 58.

The pair of second adjustment electrodes 69 include a third electrode piece 69a and a pair of fourth electrode pieces 69b. The third electrode piece 69a is provided on the second side surface 53 of the third vibrating arm 63. The third electrode piece 69a extends from the base of the third vibrating arm 63 toward the free end over the entire length of the third vibrating arm 63. The third electrode piece 69a is electrically connected to the second detection wire 56 or the fourth detection wire 58.

One fourth electrode piece 69b is provided on the second wall surface 66b inside of the first groove 64. The fourth electrode piece 69b extends from the base of the third vibrating arm 63 toward the free end over the entire length of the first groove 64. The other fourth electrode piece 69b is provided on the fourth wall surface 67b inside of the second groove 65. The fourth electrode piece 69b extends from the base of the third vibrating arm 63 toward the free end over the entire length of the second groove 65. The fourth electrode piece 69b is electrically connected to the first detection wire 55 or the third detection wire 57.

The rest of the configuration may be formed to be the same as the configuration of the above described first embodiment. The equal configurations and structures to those of the above described first embodiment have the same reference signs and their detailed explanation will be omitted.

When the vibration excited by the drive signal is transmitted to the third vibrating arm 63, the second side surface 53 expands at contraction of the first side surface 52 and the second side surface 53 contracts at expansion of the first side surface 52. As a result, the pair of second adjustment electrodes 69 may output electrical signals in anti-phase with those of the pair of first adjustment electrodes 68. In the second embodiment, the piezoelectric member is sandwiched between the first electrode piece 68a and the second electrode pieces 68b, the piezoelectric member is sandwiched between the third electrode piece 69a and the fourth electrode pieces 69b, and thus, the larger output signals may be obtained in the pair of first adjustment electrodes 68 and the pair of second adjustment electrodes 69 than those of the above described pair of first adjustment electrodes 49 and pair of second adjustment electrodes 51. The adjustment range of the vibration leakage may be wider. The yield may be improved.

(5) Gyro Sensor According to Third Embodiment

Figure 13A:
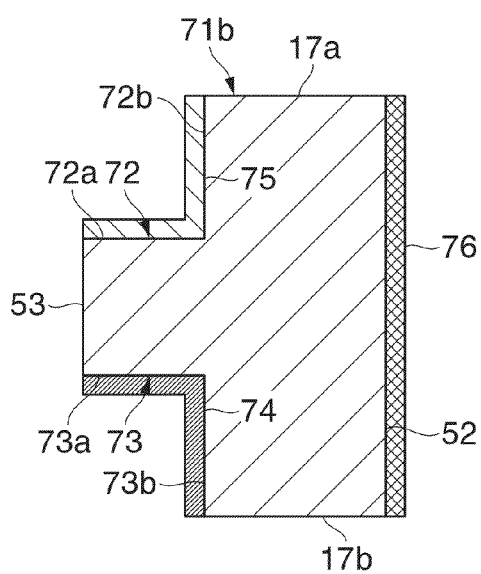
FIGS. 13A and 13B are enlarged vertical sectional views schematically showing a structure of a first vibrating arm used for a gyro sensor according to a third embodiment.
Figure 13B:
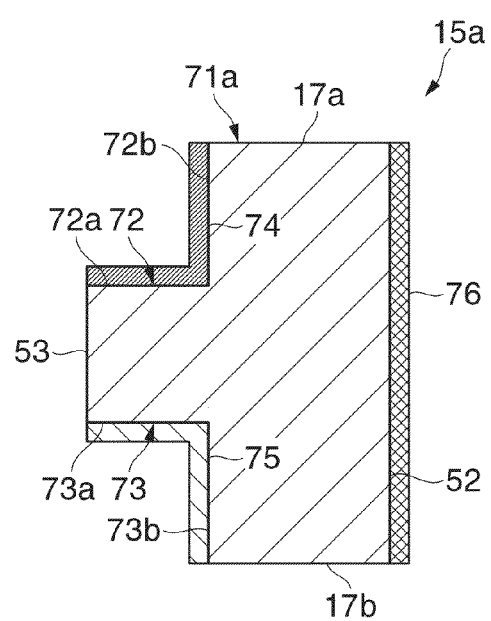

As shown in FIGS. 13A and 13B, in the gyro sensor 11 according to the third embodiment, a vibrating reed 15a includes a pair of first vibrating arms 71a, 71b in place of the above described first vibrating arms 26a, 26b. In the first vibrating arm 71a, the second side surface 53 and the front surface 17a are connected to each other at a first step 72. Similarly, the side surface 53 and the rear surface 17b are connected to each other at a second step 73. The first step 72 and the second step 73 extend from the base of the first vibrating arm 71a toward the free end over the entire length of the first vibrating arm 71a, for example. The first step 72 includes a step surface 72a specifying an edge line between the second side surface 53 and itself and a vertical surface 72b crossing the step surface 72a and specifying an edge line between the front surface 17a and itself. The piezoelectric member of the first vibrating arm 71a is sandwiched between the vertical surface 72b and the first side surface 52. Similarly, the second step 73 includes a step surface 73a specifying an edge line between the second side surface 53 and itself and a vertical surface 73b crossing the step surface 73a and specifying an edge line between the rear surface 17b and itself. The piezoelectric member of the first vibrating arm 71a is sandwiched between the vertical surface 73b and the first side surface 52. The piezoelectric member of the first vibrating arm 71a is sandwiched between the step surfaces 72a, 73a. The two first vibrating arms 71a, 71b are formed in the same shape. The step surfaces 72a, 73a may spread in parallel to the front surface 17a and the rear surface 17b. The vertical surfaces 72b, 73b may spread in parallel to the symmetry surface 29.

In the individual first vibrating arms 71a, 71b, the conducting film 18 forms a pair of first detection electrodes and a pair of second detection electrodes. In one first vibrating arm 71a, a first signal electrode 74 of the pair of first detection electrodes is fixed to the first step 72. The first signal electrode 74 covers the step surface 72a and the vertical surface 72b of the first step 72. The first signal electrode 74 extends from the base of the first vibrating arm 71a toward the free end over the entire length of the first step 72, for example. A second signal electrode 75 of the pair of second detection electrodes is fixed to the second step 73. The second signal electrode 75 covers the step surface 73a and the vertical surface 73b of the second step 73. The second signal electrode 75 extends from the base of the first vibrating arm 71a toward the free end over the entire length of the second step 73, for example. The pair of first detection electrodes and the pair of second detection electrodes have a ground electrode 76 in common. The ground electrode 76 is fixed to the first side surface 52. The ground electrode 76 covers the first side surface 52. The ground electrode 76 extends from the base of the first vibrating arm 71a toward the free end over the entire length of the first vibrating arm 71a, for example. Accordingly, the piezoelectric member of the first vibrating arm 71a is sandwiched between the first signal electrode 74 and the ground electrode 76 and sandwiched between the second signal electrode 75 and the ground electrode 76.

In the other first vibrating arm 71b, a first signal electrode 74 of the pair of first detection electrodes is fixed to the second step 73. The first signal electrode 74 covers the step surface 73a and the vertical surface 73b of the second step 73. The first signal electrode 74 extends from the base of the first vibrating arm 71b toward the free end over the entire length of the second step 73, for example. A second signal electrode 75 of the pair of second detection electrodes is fixed to the first step 72. The second signal electrode 75 covers the step surface 72a and the vertical surface 72b of the first step 72. The second signal electrode 75 extends from the base of the first vibrating arm 71b toward the free end over the entire length of the first step 72, for example. The pair of first detection electrodes and the pair of second detection electrodes have a ground electrode 76 in common. The ground electrode 76 is fixed to the first side surface 52. The ground electrode 76 covers the first side surface 52. The ground electrode 76 extends from the base of the first vibrating arm 71b toward the free end over the entire length of the first vibrating arm 71b, for example. Accordingly, the piezoelectric member of the first vibrating arm 71b is sandwiched between the second signal electrode 75 and the ground electrode 76 and sandwiched between the first signal electrode 74 and the ground electrode 76.

Figure 14:
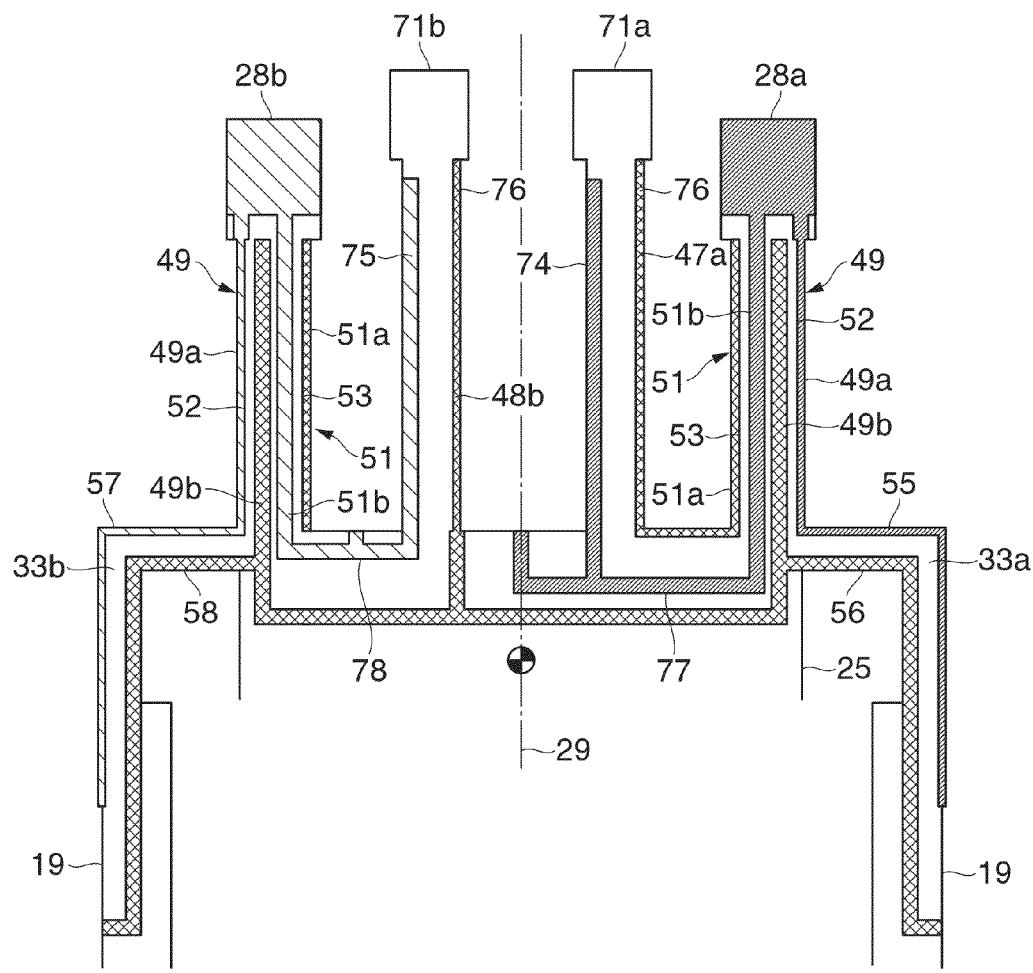
FIG. 14 is an enlarged partial plan view schematically showing a configuration of a front surface of a vibrating reed in the gyro sensor according to the third embodiment.

As shown in FIG. 14, the first signal electrode 74 of the first vibrating arm 71a is connected to the first detection wire 55. For the connection, the conducting film 18 forms a first wire 77 on the base part 25. The first wire 77 connects the first signal electrode 74 of the first vibrating arm 71a to the fourth electrode piece 51b of the third vibrating arm 28a on the front surface 17a.

The second signal electrode 75 of the first vibrating arm 71b is connected to the third detection wire 57. For the connection, the conducting film 18 forms a second wire 78 on the base part 25. The second wire 78 connects the second signal electrode 75 of the first vibrating arm 71b to the fourth electrode piece 51b of the third vibrating arm 28b on the front surface 17a.

Figure 15:
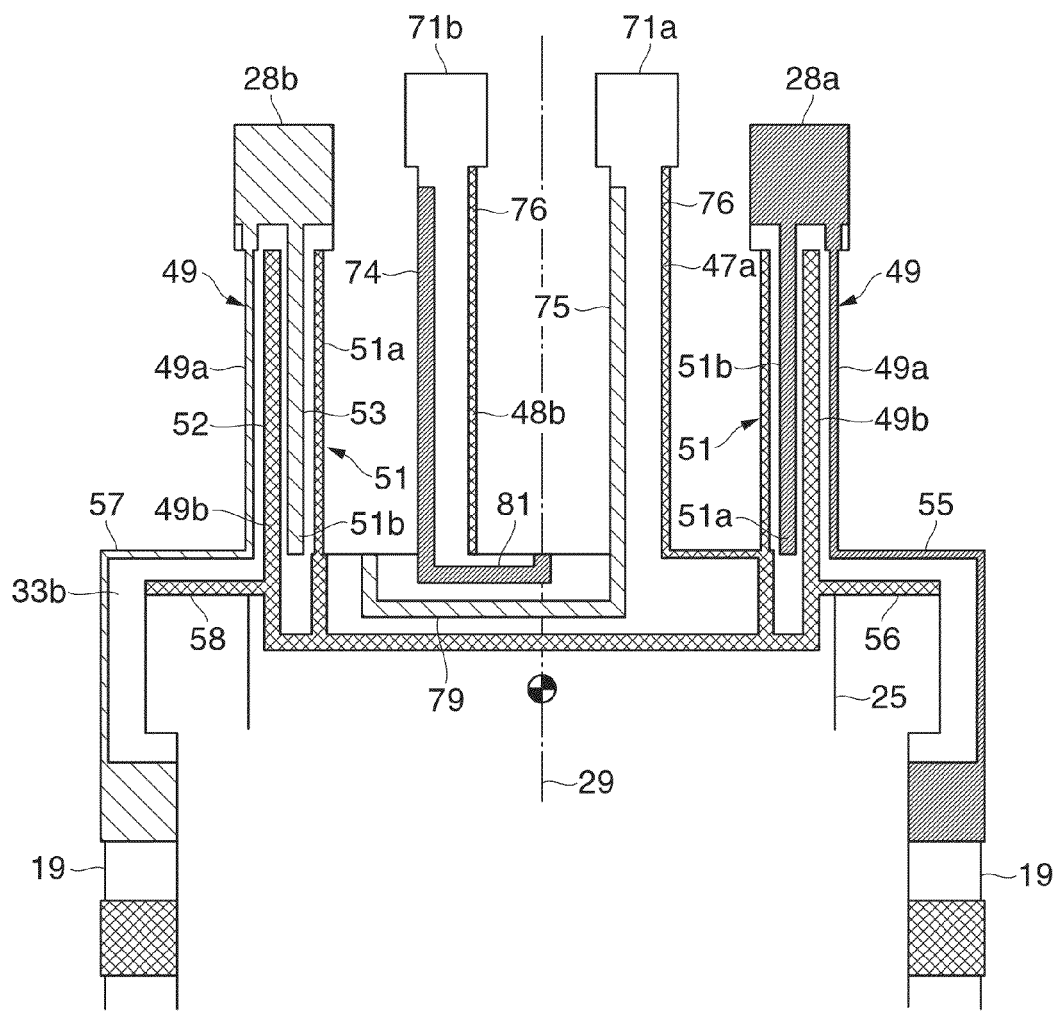
FIG. 15 is an enlarged perspective partial plan view schematically showing a configuration of a rear surface of the vibrating reed from the front side in the gyro sensor according to the third embodiment.

As shown in FIG. 15, the second signal electrode 75 of the first vibrating arm 71a is connected to the third detection wire 57. For the connection, the conducting film 18 forms a third wire 79 on the base part 25. The third wire 79 extends from the rear surface 17b to the front surface 17a between the first vibrating arm 71b and the third vibrating arm 28b. The third wire 79 is connected to the second wire 78.

The first signal electrode 74 of the first vibrating arm 71b is connected to the first detection wire 55. For the connection, the conducting film 18 forms a fourth wire 81 on the base part 25. The fourth wire 81 extends from the rear surface 17b to the front surface 17a between the first vibrating arms 71a and 71b. The fourth wire 81 is connected to the first wire 77.

The ground electrodes 76 of the first vibrating arms 71a, 71b are connected to the second detection wire 56 and the fourth detection wire 58. Here, the second detection wire 56 and the fourth detection wire 58 may be connected to each other. As a result, the ground electrodes 76 may be connected to the ground terminal 59b of the first detection terminal and the ground electrode 61b of the second detection terminal. By employing the first vibrating arms 71a, 71b, the detection sensitivity of the first vibrating arms 71a, 71b increases. The S/N-ratio is improved.

(6) Gyro Sensor According to Fourth Embodiment

Figure 16:
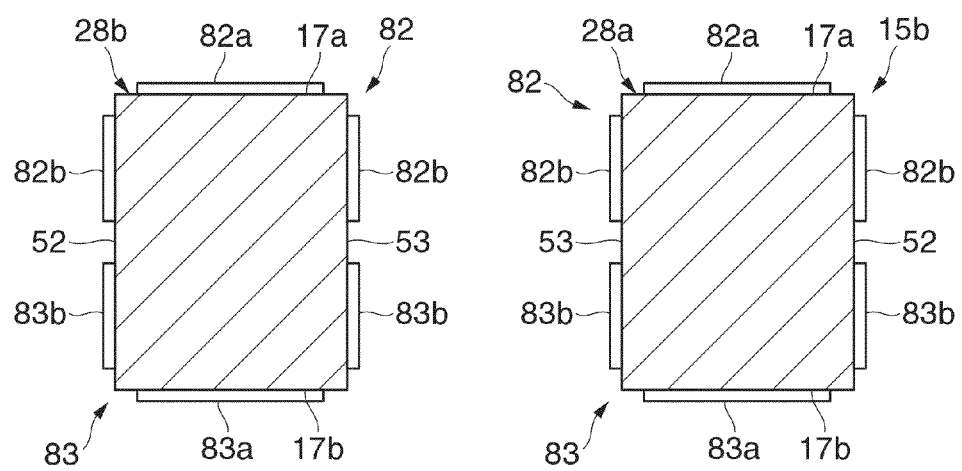
FIG. 16 is an enlarged vertical sectional view schematically showing a structure of a third vibrating arm used for a gyro sensor according to a fourth embodiment.

As shown in FIG. 16, in the gyro sensor 11 according to the fourth embodiment, a vibrating reed 15b includes a pair of first adjustment electrodes 82 and a pair of second adjustment electrodes 83 in place of the above described pair of first adjustment electrodes 49 and pair of second adjustment electrodes 51. The pair of first adjustment electrodes 82 include a first electrode piece 82a and a pair of second electrode pieces 82b. The first electrode piece 82a is provided on the front surface 17a of the third vibrating arm 28a. The first electrode piece 82a extends from the base of the third vibrating arm 28a toward the free end over the entire length of the third vibrating arm 28a.

The second electrode pieces 82b are respectively provided on the first side surface 52 and the second side surface 53 of the third vibrating arm 28a. The second electrode pieces 82b extend from the base of the third vibrating arm 28a toward the free end over the entire length of the third vibrating arm 28a. One second electrode piece 82b is adjacent to the first electrode piece 82a with the first side surface 52 and the edge line of the front surface 17a in between. The other second electrode piece 82b is adjacent to the first electrode piece 82a with the second side surface 53 and the edge line of the front surface 17a in between. Gaps are respectively partitioned between the first electrode piece 82a and the second electrode pieces 82b along the edge lines. Currents are drawn from the first electrode piece 82a and the second electrode pieces 82b in response to the deformation of the third vibrating arm 28a.

The pair of second adjustment electrodes 83 include a third electrode piece 83a and a pair of fourth electrode pieces 83b. The first electrode piece 83a is provided on the rear surface 17b of the third vibrating arm 28a. The third electrode piece 83a extends from the base of the third vibrating arm 28a toward the free end over the entire length of the third vibrating arm 28a. The fourth electrode pieces 83b are respectively provided on the first side surface 52 and the second side surface 53 of the third vibrating arm 28a. The fourth electrode pieces 83b extend from the base of the third vibrating arm 28a toward the free end over the entire length of the third vibrating arm 28a. One fourth electrode piece 83b is adjacent to the third electrode piece 83a with the first side surface 52 and the edge line of the rear surface 17b in between. The other fourth electrode piece 83b is adjacent to the third electrode piece 83a with the second side surface 53 and the edge line of the rear surface 17b in between. Gaps are respectively partitioned between the third electrode piece 83a and the fourth electrode pieces 83b along the edge lines. Currents are drawn from the third electrode piece 83a and the fourth electrode pieces 83b in response to the deformation of the third vibrating arm 28a. Similarly, the pair of first adjustment electrodes 82 and the pair of second adjustment electrodes 83 are fixed to the other third vibrating arm 28b.

Figure 17:
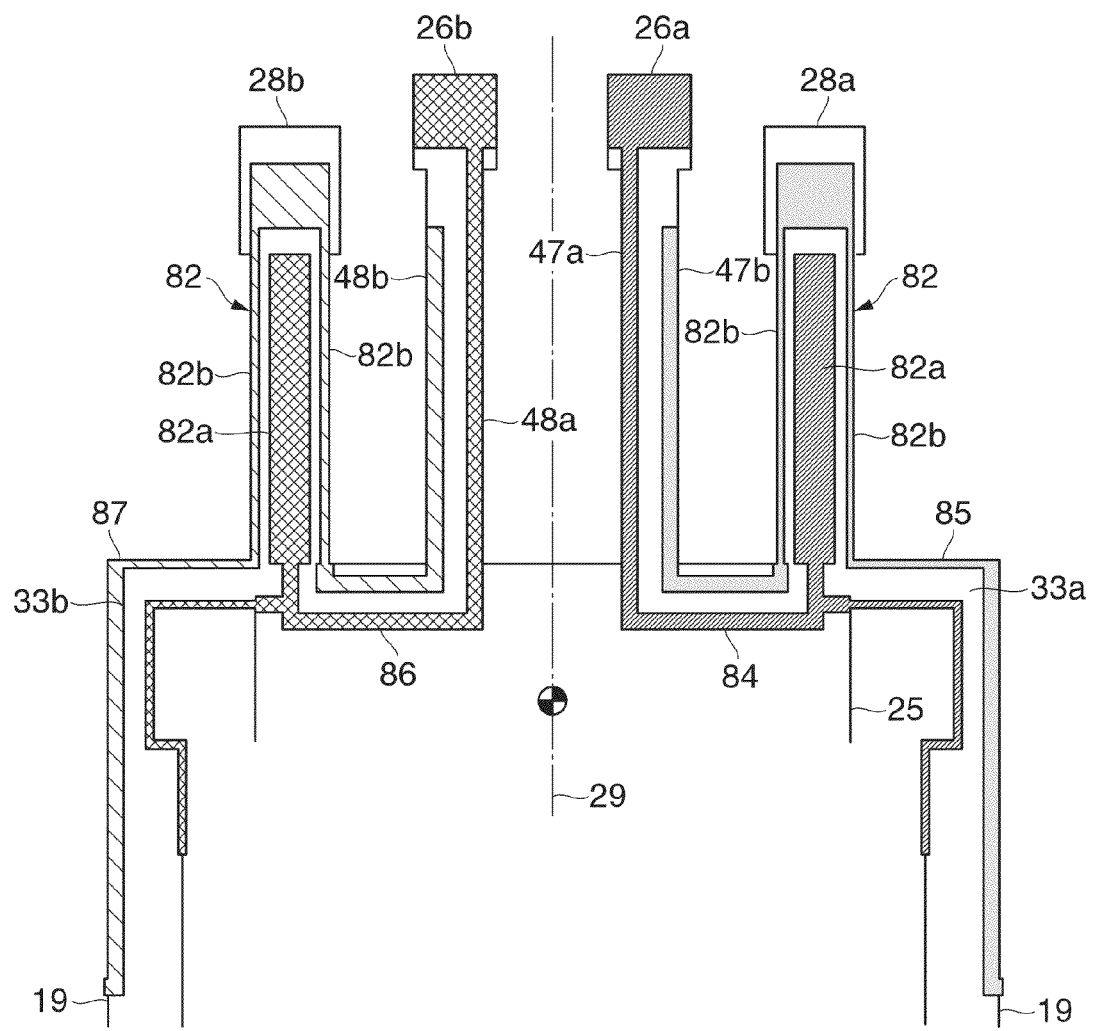
FIG. 17 is an enlarged partial plan view schematically showing a configuration of a front surface of a vibrating reed in the gyro sensor according to the fourth embodiment.

As shown in FIG. 17, the conducting film 18 forms a first detection wire 84 and a second detection wire 85. The first detection wire 84 and the second detection wire 85 are fixed to the base part 25 and one second suspended arm 33a. The first electrode piece 82a of the third vibrating arm 28a and the signal electrode 47a of the first vibrating arm 26a are electrically connected the first detection wire 84. The second electrode piece 82b and the ground electrode 47b of the first vibrating arm 26a are electrically connected the second detection wire 85. Similarly, the conducting film 18 forms a third detection wire 86 and a fourth detection wire 87. The third detection wire 86 and the fourth detection wire 87 are fixed to the base part 25 and the other second suspended arm 33b. The first electrode piece 82a of the third vibrating arm 28b and the signal electrode 48a of the first vibrating arm 26b are electrically connected the third detection wire 86. The second electrode piece 82b and the ground electrode 48b of the first vibrating arm 26b are electrically connected the fourth detection wire 87.

Figure 18:
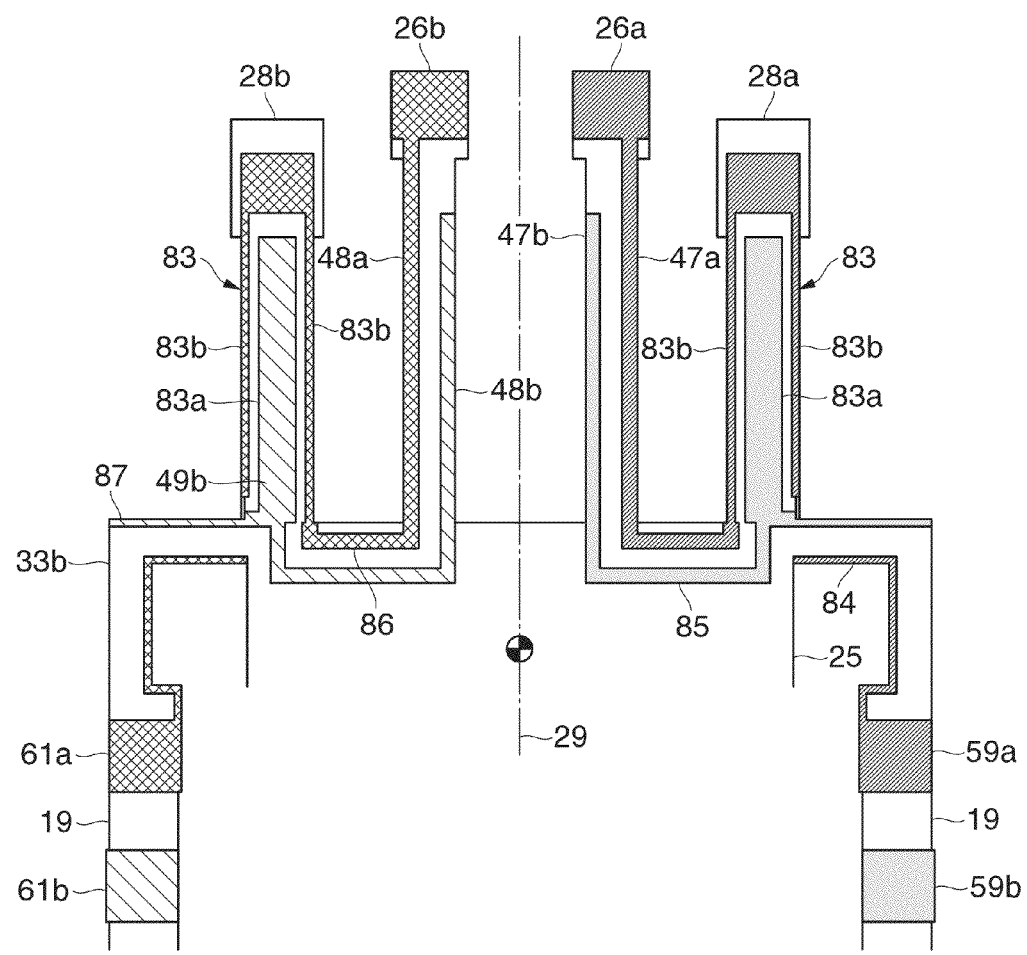
FIG. 18 is an enlarged perspective partial plan view schematically showing a configuration of a rear surface of the vibrating reed from the front side in the gyro sensor according to the fourth embodiment.

As shown in FIG. 18, the fourth electrode piece 83b of the third vibrating arm 28a and the signal electrode 47a of the first vibrating arm 26a are electrically connected to the first detection wire 84. The first detection wire 84 is electrically connected to the signal terminal 59a of the first detection terminal. The third electrode piece 83a of the third vibrating arm 28a and the ground electrode 47b of the first vibrating arm 26a are electrically connected to the second detection wire 85. The second detection wire 85 is electrically connected to the ground terminal 59b of the first detection terminal. Similarly, the fourth electrode piece 83b of the third vibrating arm 28b and the signal electrode 48a of the first vibrating arm 26b are electrically connected to the third detection wire 86. The third detection wire 86 is electrically connected to the signal terminal 61a of the second detection terminal. The third electrode piece 83a of the third vibrating arm 28b and the ground electrode 48b of the first vibrating arm 26b are electrically connected to the fourth detection wire 87. The fourth detection wire 87 is electrically connected to the ground terminal 61b of the second detection terminal.

Figure 19A:
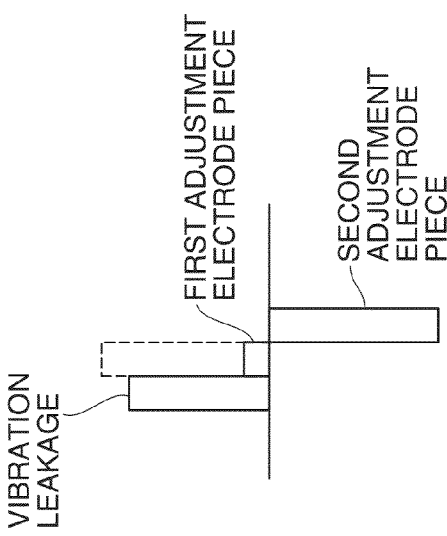
FIG. 19A is a graph schematically showing a relationship among vibration leakage, a detection signal of the first vibrating arm, and a detection signal of the third vibrating arm.
Figure 19B:
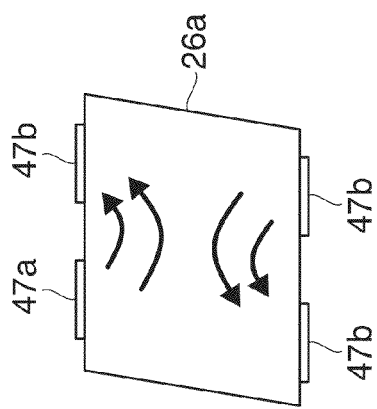
FIG. 19B is an enlarged vertical sectional view of the first vibrating arm.
Figure 19C:
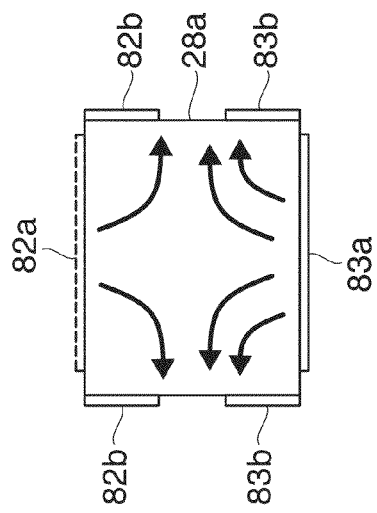
FIG. 19C is an enlarged vertical sectional view of the third vibrating arm.
Figure 20C:
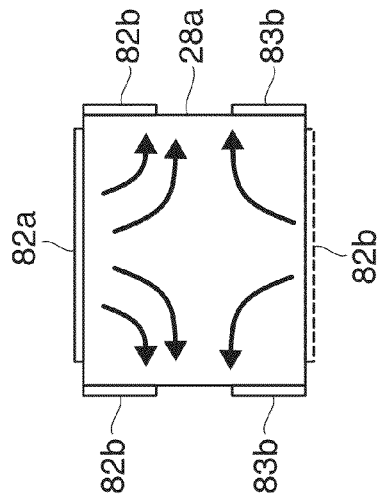
FIG. 20C is an enlarged vertical sectional view of the third vibrating arm.
Figure 20B:
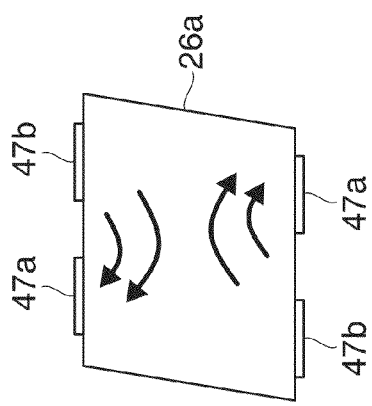
FIG. 20B is an enlarged vertical sectional view of the first vibrating arm.
Figure 20A:
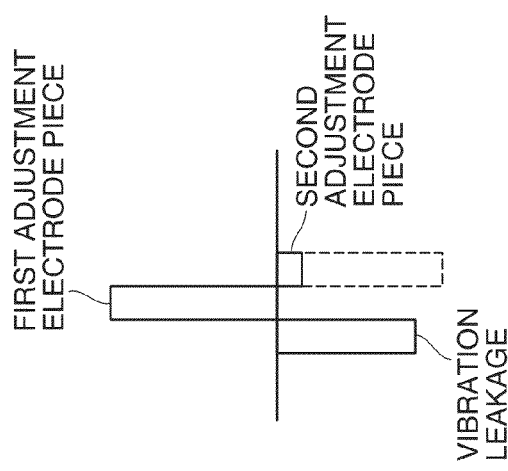
FIG. 20A is a graph schematically showing a relationship among vibration leakage, the detection signal of the first vibrating arm, and the detection signal of the third vibrating arm.

As shown in FIGS. 19A to 19C, when the shapes of the first vibrating arms 26a, 26b deviate from the designed shapes according to the processing errors, for example, in the output signals from the first vibrating arms 26a, 26b, components of vibration leakage are superimposed on the force components of the Coriolis force. Concurrently, the electrical signals of the pair of first adjustment electrodes 82 and the electrical signals of the pair of second adjustment electrodes 83 are superimposed on the output signals of the first vibrating arms 26a, 26b. The magnitudes of the electrical signals are adjusted. As a result of the adjustment, the electrical signals of the pairs of first and second adjustment electrodes 82, 83 may cancel out the components of vibration leakage. Accordingly, the S/N-ratio of the output signals is improved. For adjustment of the electrical signals, the shapes of the pair of first adjustment electrodes 82 and the pair of second adjustment electrodes 83 are adjusted in advance. The volume of the piezoelectric member intervening between the first electrode piece 82a and the second electrode pieces 82b and the distances between the first electrode piece 82a and the second electrode pieces 82b are adjusted. The volume of the piezoelectric member intervening between the third electrode piece 83a and the fourth electrode pieces 83b and the distances between the third electrode piece 83a and the fourth electrode pieces 83b are adjusted. Formation of cuts in the first vibrating arms 26a, 26b, the second vibrating arms 27a, 27b, and the third vibrating arms 28a, 28b may be avoided. The reduction in mechanical strength may be avoided. The cuts are not formed, and the improvement in processing accuracy is not necessarily required.

In addition, the electrical signals of the pair of first adjustment electrodes 82 and the electrical signals of the pair of second adjustment electrodes 83 are in anti-phase with each other, and the magnitudes of the electrical signals may be adjusted according to the relative relations between the pair of first adjustment electrodes 82 and the pair of second adjustment electrodes 83. Therefore, as clearly seen from FIGS. 19A to 19C and 20A to 20C, whether the phase of the vibration leakage is in-phase or anti-phase with the output signals of the first vibrating arms 26a, 26b, the components of vibration leakage may be cancelled out. When the electrical signals of the pair of first adjustment electrodes 82 and the electrical signals of the pair of second adjustment electrodes 83 are cancelled out by each other, the influence on the output signals of the first vibrating arms 26a, 26b by the electrical signals may be eliminated like that as described above.

(7) Gyro Sensor According to Fifth Embodiment

Figure 21:
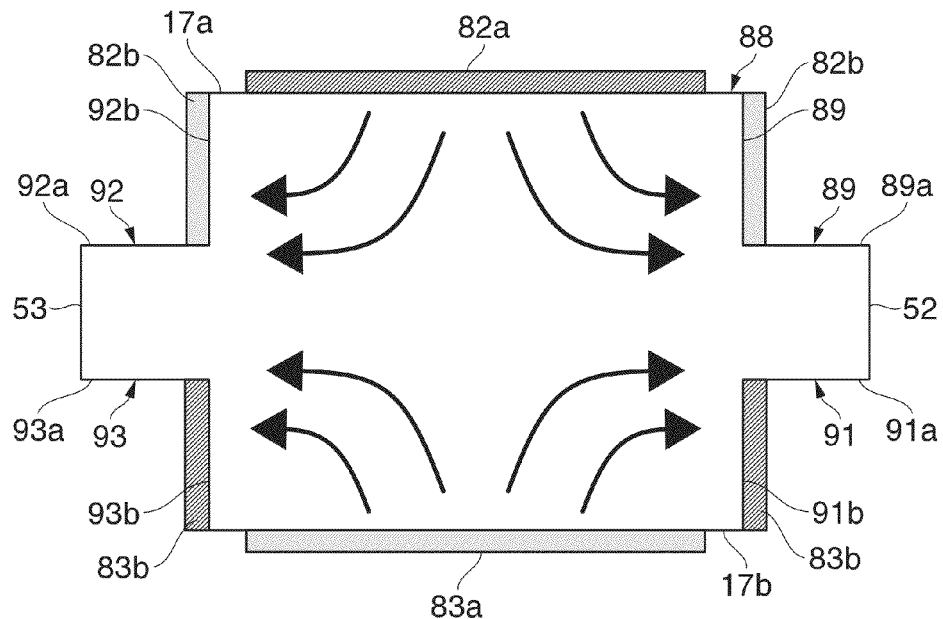
FIG. 21 is an enlarged vertical sectional view schematically showing a structure of a third vibrating arm used for a gyro sensor according to a fifth embodiment.

In the gyro sensor 11 according to the fifth embodiment, for the vibrating reed 15, a third vibrating arm 88 is used in place of the above described third vibrating arms 28a, 28b. As shown in FIG. 21, in the third vibrating arm 88, the front surface 17a and the rear surface 17b are respectively connected to the first side surface 52 at a first step 89 and a second step 91. Similarly, in the third vibrating arm 88, the front surface 17a and the rear surface 17b are respectively connected to the second side surface 53 at a third step 92 and a fourth step 93. The first to fourth steps 89 to 93 extend from the base of the third vibrating arm 88 toward the free end over the entire length of the third vibrating arm 88, for example.

The first step 89 includes a step surface 89a specifying an edge line between the first side surface 52 and itself and a vertical surface 89b crossing the step surface 89a and specifying an edge line between the front surface 17a and itself. The second step 91 includes a step surface 91a specifying an edge line between the first side surface 52 and itself and a vertical surface 91b crossing the step surface 91a and specifying an edge line between the rear surface 17b and itself. The third step 92 includes a step surface 92a specifying an edge line between the second side surface 53 and itself and a vertical surface 92b crossing the step surface 92a and specifying an edge line between the front surface 17a and itself. The fourth step 93 includes a step surface 93a specifying an edge line between the second side surface 53 and itself and a vertical surface 93b crossing the step surface 93a and specifying an edge line between the rear surface 17b and itself. A piezoelectric member of the third vibrating arm 88 is sandwiched between the vertical surfaces 89b, 92b. Similarly, the piezoelectric member of the third vibrating arm 88 is sandwiched between the vertical surfaces 91b, 93b. The second electrode pieces 82b of the first adjustment electrode 82 are respectively fixed to the vertical surface 89b of the first step 89 and the vertical surface 92b of the third step 92. The fourth electrode pieces 83b of the second adjustment electrode 83 are respectively fixed to the vertical surface 91b of the second step 91 and the vertical surface 93b of the fourth step 93.

(8) Gyro Sensor According to Sixth Embodiment

Figure 22:
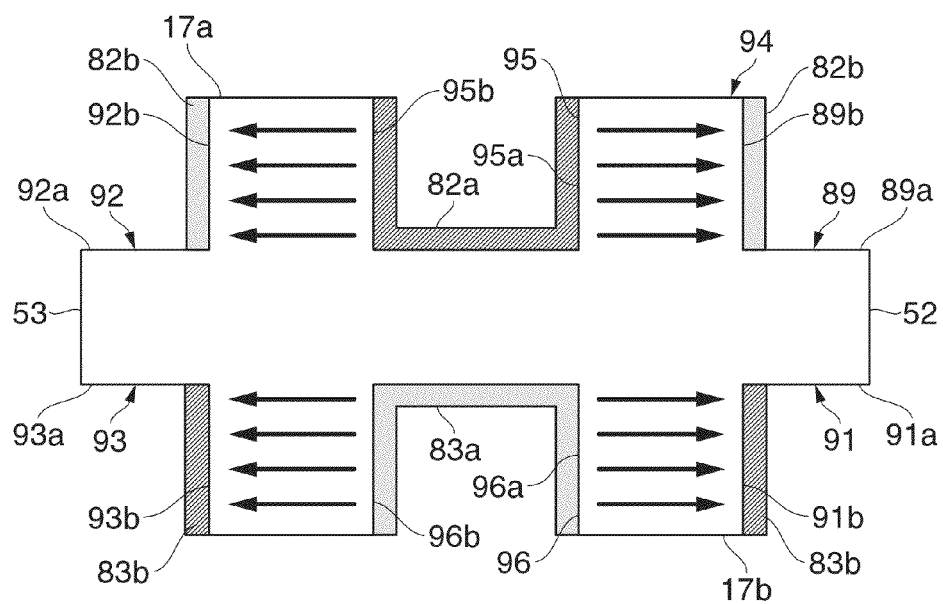
FIG. 22 is an enlarged vertical sectional view schematically showing a structure of a third vibrating arm used for a gyro sensor according to a sixth embodiment.

In the gyro sensor 11 according to the sixth embodiment, for the vibrating reed 15, a third vibrating arm 94 is used in place of the above described third vibrating arm 88. In the third vibrating arm 94, as shown in FIG. 22, a first groove 95 and a second groove 96 are formed on the front surface 17a and the rear surface 17b, respectively, in the above described third vibrating arm 88. The first groove 95 and the second groove 96 extend from the base of the third vibrating arm 94 toward the free end in the longitudinal direction of the third vibrating arm 94. The first groove 95 and the second groove 96 may be formed as long grooves extending over the entire length of the third vibrating arm 94.

The first groove 95 has a first wall surface 95a and a second wall surface 95b. The first wall surface 95a and the second wall surface 95b face each other. The first wall surface 95a sandwiches a piezoelectric member of the third vibrating arm 94 between the vertical surface 89b of the first step 89 and itself. The second wall surface 95b sandwiches the piezoelectric member of the third vibrating arm 94 between the vertical surface 92b of the third step 92 and itself. The first wall surface 95a and the second wall surface 95b may spread in parallel to the symmetry surface 29.

The second groove 96 has a third wall surface 96a and a fourth wall surface 96b. The third wall surface 96a and the fourth wall surface 96b face each other. The third wall surface 96a sandwiches the piezoelectric member of the third vibrating arm 94 between the vertical surface 91b of the second step 91 and itself. The fourth wall surface 96b sandwiches the piezoelectric member of the third vibrating arm 94 between the vertical surface 93b of the fourth step 93 and itself. The third wall surface 96a and the fourth wall surface 96b may spread in parallel to the symmetry surface 29.

The first electrode piece 82a of the pair of first adjustment electrodes 82 is fixed to the first wall surface 95a and the second wall surface 95b of the first groove 95. Therefore, the piezoelectric member of the third vibrating arm 94 is sandwiched between the first electrode piece 82a and the second electrode pieces 82b. The third electrode piece 83a of the pair of second adjustment electrodes 83 is fixed to the third wall surface 96a and the fourth wall surface 96b. Therefore, the piezoelectric member of the third vibrating arm 94 is sandwiched between the first electrode piece 83a and the second electrode pieces 83b. The rest of the configuration may be formed to be the same as the configuration of the above described first embodiment. The equal configurations and structures to those of the above described first embodiment have the same reference signs and their detailed explanation will be omitted.

When the vibration excited by the Coriolis force is transmitted to the third vibrating arm 94, the rear surface 71b expands at contraction of the front surface 17a and the rear surface 17b contracts at expansion of the front surface 17a. As a result, the pair of second adjustment electrodes 83 may output electrical signals in anti-phase with those of the pair of first adjustment electrodes 82. In the sixth embodiment, the piezoelectric member is sandwiched between the first electrode piece 82a and the second electrode pieces 82b, the piezoelectric member is sandwiched between the third electrode piece 83a and the fourth electrode pieces 83b, and thus, the larger output signals may be obtained in the pair of first adjustment electrodes 82 and the pair of second adjustment electrodes 83 than those of the above described pair of first adjustment electrodes 82 and pair of second adjustment electrodes 83. The adjustment range of the vibration leakage may be wider. The yield may be improved.

(9) Gyro Sensor According to Seventh Embodiment

Figure 23:
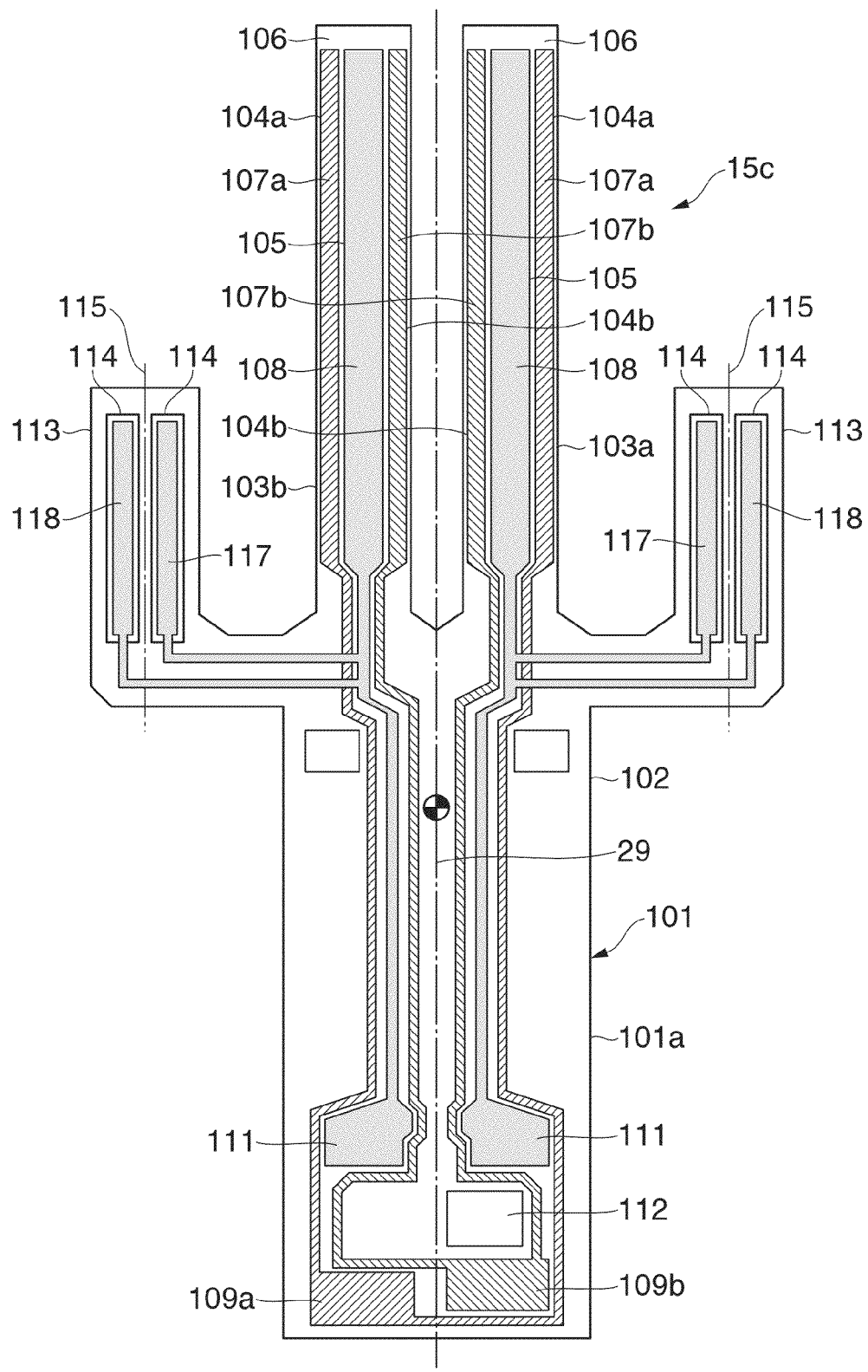
FIG. 23 is a plan view schematically showing a structure of a vibrating reed used for a gyro sensor according to a seventh embodiment.

In the gyro sensor 11 according to the seventh embodiment, a vibrating reed 15c is used in place of the above described vibrating reed 15. As shown in FIG. 23, the vibrating reed 15c includes a main body 101 having a tuning-fork shape. The main body 101 is formed in plane symmetry with respect to the symmetry surface 29 containing the center of gravity of the main body 101 and orthogonal to the first and second reference planes RP1, RP2. The main body 101 is formed using a non-piezoelectric material. Here, the main body 101 is formed using silicon (Si), for example. The main body 101 has a base part 102 and first vibrating arms 103a, 103b. The first vibrating arms 103a, 103b extend from the base part 102 in the same direction in parallel. The first vibrating arms 103a, 103b are cantilevered by the base part 102. For cantilever, a fixing part 101a is partitioned at one end of the main body 101.

A pair of drive piezoelectric members 104a, 104b and a detection piezoelectric member 105 are respectively stacked on surfaces of the first vibrating arms 103a, 103b. The drive piezoelectric members 104a, 104b and the detection piezoelectric member 105 may be formed using piezoelectric zirconate titanate (PZT), for example. For stacking of the drive piezoelectric members 104a, 104b and the detection piezoelectric member 105, a foundation film 106 of a conducting material is formed on the surface of the main body 101. The foundation film 106 may function as a common ground electrode. Drive electrodes 107a, 107b and a detection electrode 108 are fixed to the surfaces of the drive piezoelectric members 104a, 104b and the detection piezoelectric member 105, respectively. Accordingly, the drive piezoelectric members 104a, 104b are sandwiched between the drive electrodes 107a, 107b and the foundation film 106. The detection piezoelectric member 105 is sandwiched between the detection electrode 108 and the foundation film 106.

A pair of drive terminals 109a, 109b, a pair of detection terminals 111, and a ground terminal 112 are provided in the fixing part 101a. One drive terminal 109a is connected to one drive electrode 107a with respect to each of the first vibrating arms 103a, 103b. The other drive terminal 109b is connected to the other drive electrode 107b with respect to each of the first vibrating arms 103a, 103b. The detection terminal 111 is connected to the detection electrode 108. The ground terminal 112 is connected to the foundation film 106. Therefore, when drive signals are supplied to the drive electrodes 107a, 107b on the first vibrating arms 103a, 103b in anti-phase with each other, the first vibrating arms 103a, 103b flexurally move between the first reference plane PR1 and the second reference plane PR2. They move repeatedly away from and closer to each other.

The main body 101 further includes a pair of second vibrating arms 113. The second vibrating arms 113 extend in parallel to the first vibrating arms 103a, 103b. A pair of adjustment piezoelectric members 114 are stacked on the surface of the second vibrating arm 113. The adjustment piezoelectric members 114 extend in parallel to the symmetry surface 29 and to each other. The adjustment piezoelectric members 114 may be formed in line symmetry with respect to a center line 115 of the second vibrating arm 113 in parallel to the symmetry surface 29. The adjustment piezoelectric members 114 may be formed using PZT, for example. For stacking of the adjustment piezoelectric members 114, in the second vibrating arm 113, the foundation film 106 spreads on the surface of the main body 101. The foundation film 106 functions as a ground electrode. Electrode pieces 117, 118 are individually provided on the surfaces of the respective adjustment piezoelectric members 114. The electrode pieces 117, 118 may be formed in line symmetry with respect to the center line 115. The electrode pieces 117, 118 are respectively in contact with the adjustment piezoelectric members 114 in locations apart from the foundation film 106. Here, the adjustment piezoelectric members 114 are sandwiched between the electrode pieces 117, 118 and the foundation film 106.

When the vibration excited by the drive signal is transmitted to the second vibrating arm 113, the adjustment piezoelectric member 114 contracts in the longitudinal direction of the second vibrating arm 113 between the electrode piece 117 and the foundation film 106, and the adjustment piezoelectric member 114 expands in the longitudinal direction of the second vibrating arm 113 between the electrode piece 118 and the foundation film 106. Conversely, when the adjustment piezoelectric member 114 expands in the longitudinal direction of the second vibrating arm 113 between the electrode piece 117 and the foundation film 106, the adjustment piezoelectric member 114 contracts in the longitudinal direction of the second vibrating arm 113 between the electrode piece 118 and the foundation film 106. As a result, the electrode piece 117 and the electrode piece 118 may output electrical signals in anti-phase with each other.

Like the above described configuration, the components of vibration leakage contained in the output signals of the first vibrating arms 103a, 103b may be at least partially cancelled out by the electrical signals of the electrode pieces 117, 118. When the electrical signals of the electrode pieces 117, 118 are superimposed on the output signals of the first vibrating arms 103a, 103b, the S/N-ratio of the output signals is improved. In addition, the electrical signal of the electrode piece 117 and the electrical signal of the electrode piece 118 are in anti-phase with each other, and thus, the magnitudes of the electrical signals may be adjusted according to the relative relation between the electrode pieces 117, 118. Therefore, whether the phase of vibration leakage is in in-phase or anti-phase with the output signals of the first vibrating arms 103a, 103b, the component of the vibration leakage may be cancelled out. When the electrical signal of the electrode piece 117 and the electrical signal of the electrode piece 118 are balanced, the influence on the output signals of the detection vibrating arms 103a, 103b by the electrical signals may be eliminated. If the electrode pieces 117, 118 are partially removed, for example, the magnitudes of the electrical signals may be adjusted. For adjustment of the electrical signals, it is only necessary that the shapes of the electrode pieces 117, 118 are controlled, and the formation of cuts in the first vibrating arms 103a, 103b and the second vibrating arms 113 may be avoided. The reduction in mechanical strength may be avoided. The cuts are not formed, and the improvement in processing accuracy is not necessarily required.

(10) Electronic Apparatus and Others

Figure 24:
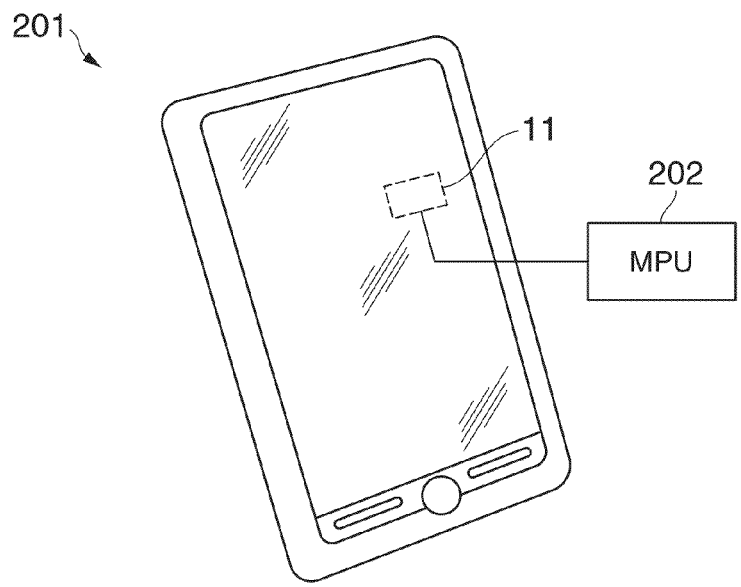
FIG. 24 is a conceptual diagram schematically showing a configuration of a smartphone as a specific example of an electronic apparatus.

FIG. 24 schematically shows a smartphone 201 as a specific example of an electronic apparatus. The gyro sensor 11 having the vibrating reeds 15, 15a to 15c is incorporated into the smartphone 201. The gyro sensor 11 may detect the position of the smartphone 201. The so-called motion sensing is performed. The detection signal of the gyro sensor 11 may be supplied to a micro computer chip (MPU) 202, for example. The MPU 202 may execute various processing in response to motion sensing. In addition, this motion sensing may be used in an electronic apparatus such as a cellular phone, a portable game machine, a game controller, a car navigation system, a pointing device, a head mounted display, and a tablet personal computer. For realization of motion sensing, the gyro sensor 11 may be incorporated.

Figure 25:
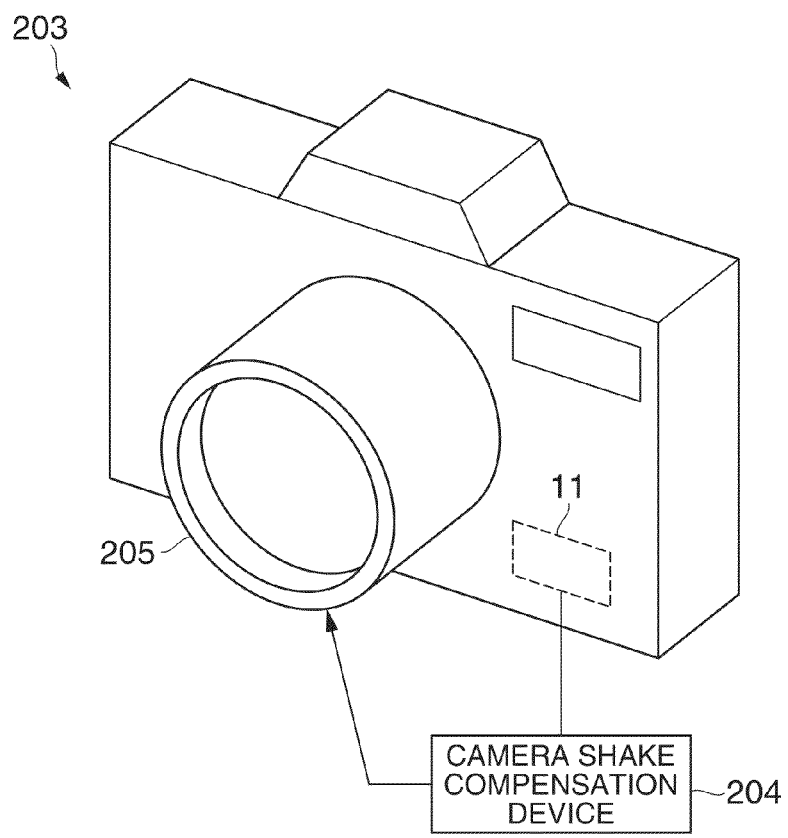
FIG. 25 is a conceptual diagram schematically showing a configuration of a digital still camera as another specific example of an electronic apparatus.

FIG. 25 schematically shows a digital still camera (hereinafter, referred to as "camera") 203 as another specific example of an electronic apparatus. The gyro sensor 11 having the vibrating reeds 15, 15a to 15c is incorporated into the camera 203. The gyro sensor 11 may detect the position of the camera 203. The detection signal of the gyro sensor 11 may be supplied to a camera shake compensation device 204. The camera shake compensation device 204 may shift a specific lens within a lens set 205, for example, in response to the detection signal of the gyro sensor 11. In this manner, camera shake is compensated. In addition, camera shake compensation may be used in a digital video camera. For realization of camera shake compensation, the gyro sensor 11 may be incorporated.

Figure 26:
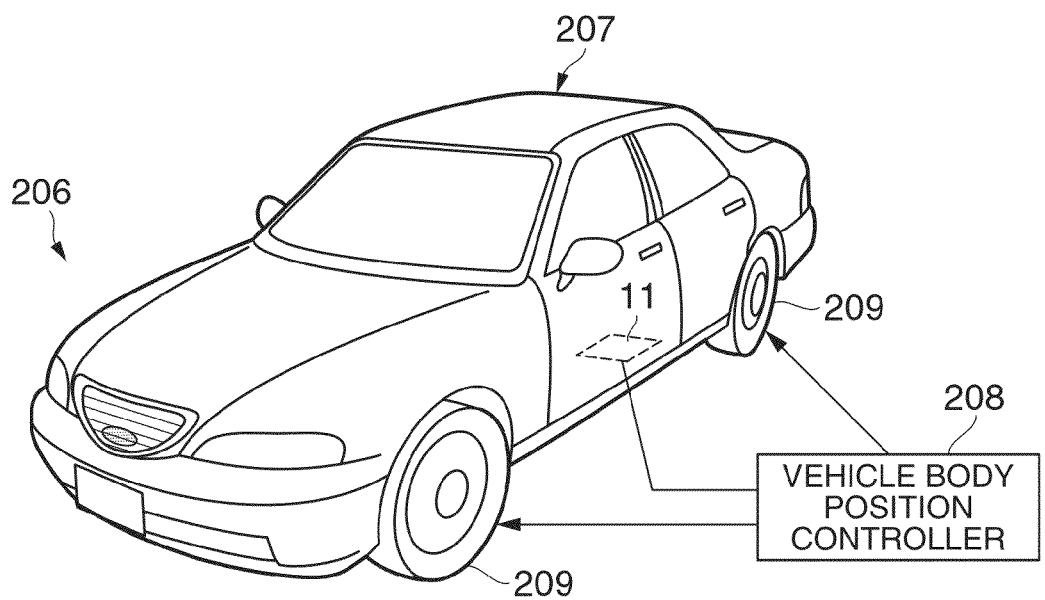
FIG. 26 is a conceptual diagram schematically showing a configuration of an automobile as a specific example of mobile unit.

FIG. 26 schematically show an automobile 206 as a specific example of mobile unit. The gyro sensor 11 having the vibrating reeds 15, 15a to 15c is incorporated into the automobile 206. The gyro sensor 11 may detect the position of a vehicle body 207. The detection signal of the gyro sensor 11 may be supplied to a vehicle body position controller 208. The vehicle body position controller 208 may control hardness of the suspension and control brakes of the individual wheels 209 in response to the position of the vehicle body 207, for example. In addition, this position control may be used in various mobile units such as a bipedal walking robot, an aircraft, and a helicopter. For realization of position control, the gyro sensor 11 may be incorporated.

Note that the embodiments have been explained in detail as above, however, a person skilled in the part could understand that many modifications may be made without substantially departing from the new matter and effects of the invention. Therefore, those modified examples may fall within the range of the invention. For example, in the above described embodiments, the examples of using quartz as the formation material as the vibrating reed have been explained, however, another piezoelectric material than quartz may be used. For example, aluminum nitride (AlN), an oxide substrate of lithium niobate ($LiNbO_3$), lithium tantalate ($LiTaO_3$), piezoelectric zirconate titanate (PZT), lithium tetraborate ($Li_2B_4O_7$), langasite ($La_3Ga_5SiO_{14}$), or the like, a multilayer piezoelectric substrate formed by stacking a piezoelectric material such as aluminum nitride or tantalum pentoxide ($Ta_2O_5$) on a glass substrate, or piezoelectric ceramics may be used. Further, in the specification and the drawings, the terms described with the different broader or synonymous terms may be replaced by the different terms in any part of the specification and the drawings. Furthermore, the configurations and movements of the vibrating reeds 15, 15a to 15c, the gyro sensor 11, the electronic apparatus, the mobile unit are not limited to those explained in the embodiments, but various modifications may be made.

The entire disclosure of Japanese Patent Application No. 2012-102896, filed Apr. 27, 2012 is expressly incorporated by reference herein.

What is claimed is:

1. A vibrating reed comprising:
   a base part;
   a drive vibrating arm and a detection vibrating arm extending from the base part;
   an adjustment vibrating arm extending from the base part;
   a first adjustment electrode provided above the adjustment vibrating arm and generating an electrical signal in first phase;
   a second adjustment electrode provided above the adjustment vibrating arm and generating an electrical signal in second phase opposite to the first phase,
   wherein the adjustment vibrating arm includes
   a first surface,
   a second surface opposite to the first surface,
   a first side surface and a second side surface connecting the first surface and the second surface,
   a first groove formed on the first surface and extending in a longitudinal direction of the adjustment vibrating arm, and having a first wall surface at the first side surface side and a second wall surface at the second side surface side, and
   a second groove formed on the second surface and extending in the longitudinal direction of the adjustment vibrating arm, and having a third wall surface at the first side surface side and a fourth wall surface at the second side surface side,
   the first adjustment electrode includes a first electrode piece provided above the first side surface, and second electrode pieces provided above the first wall surface and the third wall surface, and the second adjustment electrode includes a third electrode piece provided above the second side surface, and fourth electrode pieces provided above the second wall surface and the fourth wall surface.

2. The vibrating reed according to claim 1, wherein the electrical signal of the adjustment vibrating arm is in anti-phase with an electrical signal of vibration leakage of the detection vibrating arm.

3. The vibrating reed according to claim 1, wherein a detection electrode that generates an electrical signal in response to a physical quantity applied to the drive vibrating arm is provided above the detection vibrating arm, the first adjustment electrode and the detection electrode are electrically connected, and the second adjustment electrode and the detection electrode are electrically connected.

4. A gyro sensor comprising the vibrating reed according to claim 1.

5. An electronic apparatus comprising the vibrating reed according to claim 1.

6. A mobile unit comprising the vibrating reed according to claim 1.

7. A vibrating reed comprising:

a base part;

a drive vibrating arm and a detection vibrating arm extending from the base part;

an adjustment vibrating arm extending from the base part;

first adjustment electrodes being in contact with a piezoelectric member provided above the adjustment vibrating arm in locations apart from each other and generating electrical signals in first phase, and second adjustment electrodes being in contact with the piezoelectric member provided above the adjustment vibrating arm in locations apart from each other and generating electrical signals in second phase opposite to the first phase.

8. The vibrating reed according to claim 7, wherein the electrical signal of the adjustment vibrating arm is in anti-phase with an electrical signal of vibration leakage of the detection vibrating arm.

9. The vibrating reed according to claim 7, wherein a detection electrode that generates an electrical signal in response to a physical quantity applied to the drive vibrating arm is provided on the detection vibrating arm, the first adjustment electrode and the detection electrode are electrically connected, and the second adjustment electrode and the detection electrode are electrically connected.

10. A gyro sensor comprising the vibrating reed according to claim 7.

11. An electronic apparatus comprising the vibrating reed according to claim 7.

12. A mobile unit comprising the vibrating reed according to claim 7.

* * * * *